(12) United States Patent
Yuba et al.

(10) Patent No.: US 7,977,028 B2
(45) Date of Patent: Jul. 12, 2011

(54) PHOTOSENSITIVE RESIN COMPOSITION AND ADHESION PROMOTER

(75) Inventors: Tomoyuki Yuba, Kyoto (JP); Yoji Fujita, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 625 days.

(21) Appl. No.: 11/994,300

(22) PCT Filed: Apr. 18, 2006

(86) PCT No.: PCT/JP2006/308093
§ 371 (c)(1),
(2), (4) Date: Dec. 28, 2007

(87) PCT Pub. No.: WO2007/004345
PCT Pub. Date: Jan. 11, 2007

(65) Prior Publication Data
US 2009/0123867 A1    May 14, 2009

(30) Foreign Application Priority Data

Jun. 30, 2005  (JP) .................................. 2005-191346

(51) Int. Cl.
*G03F 7/075* (2006.01)
*G03F 7/028* (2006.01)
*G03F 7/032* (2006.01)
*G03F 7/20* (2006.01)
*G03F 7/30* (2006.01)

(52) U.S. Cl. .................... 430/270.1; 430/325; 430/326; 430/905; 430/910; 430/914; 430/916

(58) Field of Classification Search .................. None
See application file for complete search history.

(56) References Cited

U.S. PATENT DOCUMENTS

| | | | |
|---|---|---|---|
| 4,374,742 A * | 2/1983 | Evans et al. | 508/204 |
| 5,025,042 A | 6/1991 | Yoshida et al. | |
| 6,410,206 B1 * | 6/2002 | Ueda et al. | 430/280.1 |
| 2005/0142297 A1 * | 6/2005 | Sugiura et al. | 427/384 |

FOREIGN PATENT DOCUMENTS

| | | | |
|---|---|---|---|
| JP | 48079617 | | 10/1973 |
| JP | 60169847 | | 9/1985 |
| JP | 60240703 | | 11/1985 |
| JP | 61-112086 | * | 5/1986 |
| JP | 63015847 | | 1/1988 |
| JP | 03089350 | | 4/1991 |
| JP | 6157875 | | 6/1994 |
| JP | 07-033785 | | 3/1995 |
| JP | 09146274 | | 6/1997 |
| JP | 2000164608 | | 6/2000 |
| JP | 2000187321 | | 7/2000 |
| JP | 2002179688 | | 6/2002 |
| JP | 2002212192 | | 7/2002 |
| JP | 2002258485 | | 9/2002 |
| JP | 2002328472 | | 11/2002 |
| JP | 2003076017 | | 3/2003 |
| JP | 2005043883 | | 2/2005 |

OTHER PUBLICATIONS

Derwent English abstract for JP61-112086 (1986).*
Machine-assisted English translation of JP7-33785 as provided by JPO (1995).*
Office Action in related Japanese application No. 200680024028.2 issued May 19, 2010.

* cited by examiner

*Primary Examiner* — Sin J. Lee
(74) *Attorney, Agent, or Firm* — Pillsbury Winthrop Shaw Pittman LLP

(57) ABSTRACT

The present invention provides a photosensitive resin composition comprising (a) an alkali-soluble resin, (b) a silicon compound having a secondary aromatic amino group and an alkoxy group, and (c) at least one selected from a photopolymerization initiator, a photo acid generator and a photo base generator. According to the present invention, it is possible to obtain a photosensitive resin composition which remarkably enhances the adhesion property with a substrate after curing without deteriorating storage stability of a solution, and does not cause peeling of a fine pattern even upon development.

5 Claims, No Drawings

PHOTOSENSITIVE RESIN COMPOSITION AND ADHESION PROMOTER

CROSS REFERENCE TO RELATED APPLICATIONS

This application is the U.S. national phase of PCT/JP2006/308093 filed Apr. 18, 2006, and claims the benefit of Japanese Patent Application No. 2005-191346 filed on Jun. 30, 2005, both of which are incorporated by reference herein. The PCT application published in Japanese as WO2007/004345 A1.

TECHNICAL FIELD

The present invention relates to a photosensitive resin composition and an adhesion promoter, which are suited for use in a surface protective coat and an interlayer dielectric film of a semiconductor device, and an insulating layer of an organic electro-luminescent devise.

BACKGROUND ART

A heat-resistant resin is utilized in an interlayer dielectric film and a surface protective coat (buffer coat alpha ray shielding film) in the semiconductor field. The heat-resistant resin is inferior in pattern processing and is therefore converted into an insoluble and infusible heat-resistant resin by forming a coating film using a heat-resistant resin precursor having high solubility in an organic solvent, performing pattern processing using a photoresist and thermocuring the precursor. It has recently been made a trial of simplifying a photoresist step using a negative or positive photosensitive heat-resistant resin precursor composition which itself is capable of performing pattern processing.

As a negative photosensitive heat-resistant resin precursor composition in which the exposed area is remained after development, for example, there has been known a composition prepared by adding an amino compound containing an organic group capable of being dimerized by actinic radiation or a polymerizable carbon-carbon double bond, or a quaternized salt thereof to polyamic acid, a composition prepared by adding acrylamides to polyamic acid, or a polyimide precursor having a carbon-carbon double bond group in the side chain or the main chain of a polymer.

As a positive heat-resistant resin precursor composition in which the exposed area is dissolved by development, for example, there has been known a composition prepared by adding quinonediazide to polyamic acid, a composition prepared by adding quinonediazide to a soluble polyimide having a hydroxyl group, or a composition prepared by adding quinonediazide to polyamide having a hydroxyl group.

As these resin precursor compositions, for example, there have been developed a composition prepared by adding a phenolic hydroxyl group-containing thermocrosslinking compound to a poyamidate ester and/or a polyamic acid polymer (see, for example, Japanese Unexamined Patent Publication (Kokai) No. 2002-328472 (claim 1)), a composition prepared by adding a compound having two or more alkoxymethyl groups and a phenolic hydroxyl group in the molecule or a compound having plural methylol groups and a phenolic hydroxyl group to a polyimide precursor or polyimide which is soluble in an aqueous alkali solution, a composition prepared by adding an iodonium salt as a dissolution inhibitor to a poyamidate ester, a composition prepared by adding an iodonium salt as a dissolution inhibitor to a polyamide, a composition prepared by adding a photo acid generator and a vinyloxy group-containing compound to a polyamidate ester, a composition prepared by adding a photo acid generator to a polyamidate ester having an acid dissociable group, and a composition prepared by adding a compound capable of accelerating solubility through an action of a photo acid generator and an acid to a polybenzooxazole precursor.

With recent miniaturization of wiring, fine processability of an isolated pattern having a size of 5 µm is required to a heat-resistant resin. However, a conventional resin composition had a problem that a developing solution penetrates into a space between a pattern and a substrate upon development, and an isolated pattern is peeled, or peeled in an acceleration test at high temperature and high humidity because of poor adhesion property between the pattern and the substrate after curing.

As a method of improving the adhesion property after development and curing, for example, a method of preliminarily subjecting the side of a substrate to a surface treatment such as an oxygen plasma treatment is known. However, it was required by the industrial field to omit such a complicated treatment. Therefore, a method of copolymerizing a photosensitive resin with a silicone component (see Japanese Unexamined Patent Publication ((Kokai) No. 6-157875) and a method of adding a silane coupling agent to a photosensitive resin composition are proposed (see Japanese Unexamined Patent Publication (Kokai) No. 2003-76017, and Japanese Unexamined Patent Publication (Kokai) No. 9-146274). However, there was a problem that, when a particularly effective aminosilane-based compound is added as a silane coupling agent, a photosensitive component is decomposed and thus storage stability of the solution drastically deteriorates. Also, when a siliconediamine is copolymerized, it is impossible to cope with a problem that a fine pattern is peeled upon development.

DISCLOSURE OF THE INVENTION

In the present invention, it is an object to provide a photosensitive resin composition which remarkably enhances the adhesion property with a substrate after curing without deteriorating storage stability of a solution, and does not cause peeling of a fine pattern even upon development.

Namely, the present invention provides a photosensitive resin composition comprising (a) an alkali-soluble resin, (b) a silicon compound having a secondary aromatic amino group and an alkoxyl group, and (c) at least one selected from a photopolymerization initiator, a photo acid generator and a photo base generator.

Effects of the Invention

According to the present invention, it is possible to obtain a photosensitive resin composition which remarkably enhances the adhesion property with a substrate after curing without deteriorating storage stability of a solution, and does not cause peeling of a fine pattern even upon development.

BEST MODE FOR CARRYING OUT THE INVENTION

The alkali-soluble resin in the present invention refers to a resin which is soluble in an aqueous alkali solution. As used herein, the expression "soluble in an aqueous alkali solution" means that the thickness of a coating film having a thickness of about 4 µm, which is formed using a γ-butyrolactone solution having a resin concentration of 40% and prebaking at 120° C. for 4 minutes, decreases at a rate within a range from 50 nm/min to 100,000 nm/min when subjected to a treatment with an aqueous 2.38% tetramethylammonium hydroxide solution. The rate is more preferably from 100 nm/min to 30,000 nm/min. Examples of the alkali-soluble resin (a) include a polyamic acid as a polyimide precursor, polyhydroxyamide as a polybenzooxazole precursor, an acrylic polymer obtained by copolymerizing an acrylic acid, a novolak resin, and a siloxane resin. Such a resin is dissolved in an aqueous solution of an alkali such as choline, triethylamine, dimethylaminopyridine, monoethanolamine, diethylaminoethanol, sodium hydroxide or sodium carbonate, in addition to tetramethylammonium hydroxide. These resins may be used alone, or a plurality of them may be used in combination. The resin may be mix with other resins as long as it can be dissolved in an aqueous alkali solution.

Examples of the alkali-soluble resin, which can be preferably used in the present invention, include a polyamic acid. The polyamic acid can be converted into a polyimide by heating within a range from 200° C. to 500° C. The polyimide is one of resins, which exhibits maximum heat resistance, among organic resins and can be widely used in electronic components in view of excellent heat resistance, electrical characteristics and mechanical properties. The polyamic acid as a polyimide precursor can be obtained by mixing a tetracarboxylic acid or a derivative thereof such as tetracarboxylic dianhydride, a dicarboxylic acid diester, a tetracarboxylic acid tetraester, a dicarboxylic acid diamide with a diamine or a derivative thereof such as a trimethylsilylated diamine in a solvent. In view of ease of reacting, a tetracarboxylic dianhydride and a diamine are preferably used.

Examples of the tetracarboxylic dianhydride include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, and 2,2-bis(3,4-dicarboxyphenyl)hexafluoropropane dianhydride; and aliphatic tetracarboxylic dianhydrides such as butanetetracarboxylic dianhydride and 1,2,3,4-cyclopentanetetracarboxylic dianhydride. These dianhydrides can be used alone, or two or more kinds of them can be used in combination.

Specific examples of the diamine, which can be used as a material of the polyimide, include 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzine, m-phenylenediamine, P-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or compounds in which the aromatic ring thereof is substituted with an alkyl group or a halogen atom, aliphatic cyclohexyldiamines and methylenebiscyclohexylamines.

Of these diamines, 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, m-phenylenediamine, p-phenylenediamine, and 1,4-bis(4-aminophenoxy)benzene are preferable. 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, and 1,4-bis(4-aminophenoxy)benzene are particularly preferable. These diamines can be used alone, or two or more kinds of them can be used in combination.

A diamine having an alkali-soluble group such as a phenolic hydroxyl group, a carboxyl group, a thiol group, a sulfonic acid group, or a sulfonamide group is more preferable.

It is possible to preferably used, in addition to the polyamic acid, a poyamidate ester, a polyisoimide, a polyamic acid sulfonamide, and a polyamic acid having an imidation ratio of 5 to 50 mol % or more. It is also possible to use a polyimide which has an alkali-soluble group such as a hydroxyl group, a carboxyl group, or a sulfonic acid group, and also has an imidation ratio of 50% or more.

It is possible to enhance the adhesion property of the composition after curing to the substrate and to enhance resistance to oxygen plasma and a UV ozone treatment by further adding the following components to the polyimide resin used in the present invention using a method of adding, as a silicone component, a silane coupling agent such as trimethoxyaminopropylsilane, trimethoxyepoxysilane, trimethoxyvinylsilane, or trimethoxythiolpropylsilane to a polyimide precursor solution; or a method of copolymerizing or blending, as an acid component constituting a polyimide, a silicone atom-containing tetracarboxylic acid such as dimethylsilanediphthalic acid or 1,3-bis(phthalic acid)tetramethyldisiloxane in the proportion of 1 to 30 mol % based on the entire tetracarboxylic acid component; or a method of copolymerizing or blending, as a diamine component, a silicone atom-containing diamine such as 1,3-bis(3-aminopropyl)tetramethyldisiloxane or 1,3-bis(4-anilino)tetramethyldisiloxane in the proportion of 1 to 30 mol % based on the entire diamine component.

The alkali-soluble resin used in the present invention includes, for example, a polybenzooxazole precursor or an alkali-soluble polybenzooxazole. Such a resin can be obtained, for example, by reacting a bisaminophenol compound with a dicarboxylic acid. The bisaminophenol compound is reacted with the dicarboxylic acid to obtain a polyhydroxyamide, which is heated to obtain a polybenzooxazole resin.

Examples of the bisaminophenol compound include dihydroxydiaminobenzene, dihydroxydiaminobiphenyl, bis(aminohydroxyphenyl)sulfone, bis(aminohydroxyphenyl)propane, bis(aminohydroxyphenyl)hexafluoropropane, and bis(hydroxyaminophenyl)cyclohexane.

It is possible to use, as the dicarboxylic acid, aromatic dicarboxylic acids such as terephthalic acid, isophthalic acid, diphenyletherdicarboxylic acid, diphenylsulfonedicarboxylic acid, biphenyldicarboxylic acid, bis(carboxyphenyl)hexafluoropropane, diphenylmethanedicarboxylic acid, bis (carboxyl)phenylpropane, and terphenyldicarboxylic acid; and aliphatic dicarboxylic acids such as adipic acid, sebacic acid, dodecanoic acid, diethylglutaric acid, cyclohexanedicarboxylic acid, and norbornenedicarboxylic acid.

It is preferred to use, as the polybenzooxazole resin, a polybenzooxazole resin having an alkali-soluble group such as a carboxyl group, a hydroxyl group, or a sulfonic acid group in the side chain in view of alkali solubility. It is also possible to use a polybenzooxazole resin, in which a ratio of conversion of a polybenzooxazole precursor into oxazole is terminated at 10 to 80%.

Similar to the polyimide resin, the terminal of the polybenzooxazole precursor or an alkali-soluble polybenzooxazole can be blocked using monoamines, an acid anhydride, an acid chloride, or a monocarboxylic acid.

Furthermore, it is possible to enhance the adhesion property of the composition after curing to the substrate and to enhance resistance to oxygen plasma and a UV ozone treatment by a method of adding a silane coupling agent such as trimethoxyaminopropylsilane, trimethoxyepoxysilane, trimethoxyvinylsilane, or trimethoxythiolpropylsilane to a polybenzooxazole precursor solution; a method of copolymerizing a silicone atom-containing bisaminophenol such as bis(aminohydroxyphenyl)dimethylsilane or a diamine compound such as 1,3-bis(3-aminopropyl)tetramethyldisiloxane or 1,3-bis(4-anilino)tetramethyldisiloxane in the proportion of 1 to 30 mol % in a polybenzooxazole precursor backbone; or a method of adding a polyimide resin or polyimide precursor containing a silicon atom.

The alkali-soluble resin used in the present invention includes, for example, a novolak resin. The novolak resin is obtained by an addition condensation reaction of phenols and formaldehyde in the presence of toluenesulfonic acid, oxalic acid or hydrochloric acid. The reaction for obtaining a polymer is known as a usual method.

Specific examples of the phenols include phenol, cresol, resorcinol, xylenol, ethylphenol, trimethylphenol, propylphenol, butylphenol, dihydroxybenzene, and naphthols. These phenols can be used alone, or two or more kinds of them can be used in combination. As the formaldehyde used in the addition condensation reaction with the phenols, for example, an aqueous formaldehyde solution (formalin) or paraformaldehyde is used.

The addition condensation reaction between the phenols and the formaldehyde is usually conducted at 60 to 120° C. for 2 to 30 hours. In this reaction, an organic acid, an inorganic acid and a divalent metal salt are usually used as a catalyst. Specific examples of the catalyst include oxalic acid, hydrochloric acid, sulfuric acid, perchloric acid, p-toluenesulfonic acid, trichloroacetic acid, phosphoric acid, formic acid, zinc acetate, and magnesium acetate. This addition condensation reaction may be conducted with or without using a proper solvent. The polymer thus obtained is introduced into methanol or water to produce a precipitate, and thus monomers and a catalyst are removed. The polymer is dried to obtain a polymer powder composed of a novolak resin.

It is possible to obtain a positive photosensitive resin, which makes the exposed area soluble, by adding a photo acid generator such as naphthoquinonediazide or a polyphenol compound for adjusting solubility to the novolak resin.

Also, it is possible to obtain a negative photosensitive resin, which makes the exposed area insoluble, by adding a benzylamine-based compound to a novolak resin, thereby using a crosslinking agent capable of being crosslinked by an action of an acid in combination with a photo acid generator, or using a crosslinking agent capable of being crosslinked by an action of an amine in combination with a photoamine generator. When used in a dielectric film of an organic luminescent devise, it is preferred to use a positive photosensitive resin as compared with a negative photosensitive resin in view of a taper shape of the resulting pattern cross section.

It is possible to enhance the adhesion property of the composition after curing to the substrate and to enhance oxygen plasma resistance and UV ozone resistance by further adding a silane coupling agent such as trimethoxyaminopropylsilane, trimethoxyepoxysilane, trimethoxyvinylsilane, or trimethoxythiolpropylsilane, or adding a silane coupling agent such as hydroxyphenyltrimethoxysilane, or blending a polyimide resin containing a silicone atom, a polyimide precursor, a polybenzooxazole resin or a polybenzooxazole precursor to the novolak resin.

The alkali-soluble resin used in the present invention includes, for example, an acrylic resin. The acrylic resin is obtained by polymerizing a monomer containing an acrylic monomer using a radical initiator such as benzoyl peroxide or azoisobutylnitrile, an anionic polymerization initiator such as sodium methoxide, sodium, or butyl lithium, or a cationic polymerization initiator such as sulfuric acid or phosphoric acid. The polymerization of a polymer is a usual method.

Examples of the acrylic monomer include alkyl methacrylate esters or cycloalkyl methacrylate esters, such as acrylic acid, methyl methacrylate, ethyl methacrylate, propyl methacrylate, butyl methacrylate, isobutyl methacrylate, 2-ethylhexyl methacrylate, lauryl methacrylate, and clohexyl methacrylate; hydroxyalkyl methacrylates such as 2-hydroxyethyl methacrylate and 2-hydroxypropyl methacrylate; aminoalkyl methacrylates such as aminomethyl methacrylate, N-methylaminomethyl methacrylate, and N,N-diethylaminoethyl methacrylate; and methacrylamide. Examples of the copolymerizable component include vinyl monomers such as styrene and vinyltoluene; styrene-based monomers such as α-methylstyrene; vinyl derivatives such as vinyl chloride, vinylidene chloride, vinyl acetate, and propenyl acetate; unsaturated dibacic acids such as maleic acid and fumaric acid; an acid anhydride thereof; monoesters such as a monomethyl ester and a monoethyl ester thereof; and diesters such as a dimethyl ester and a diethyl ester thereof. It is preferred to copolymerize an acrylic monomer having a phenyl group or a carboxyl group, such as hydroxystyrene, methacrylic acid, acrylic acid, and maleic acid so as to introduce an alkali-soluble group.

It is also possible to improve impact resistance by further mixing the acrylic resin with an elastomer component such as an acrylic rubber.

It is possible to enhance the adhesion property of the composition after curing to the substrate and to enhance oxygen plasma resistance and UV ozone resistance by further adding a silane coupling agent such as trimethoxyaminopropylsilane, trimethoxyepoxysilane, trimethoxyvinylsilane, trimethoxythiolpropylsilane, or trimethoxyhydroxyphenylsilane, or blending a polyimide resin containing a silicone atom, a polyimide precursor, a polybenzooxazole resin or a polybenzooxazole precursor to the acrylic resin.

The alkali-soluble resin used in the present invention includes, for example, a siloxane resin. As a silica-based resin, a hydrolyzate or a condensate of an alkoxysilane is preferably used. A resin having an alkali-soluble silanol group can be obtained by terminating hydrolysis or condensation at proper timing.

Examples of the alkoxysilane include alkoxysilanes such as tetramethoxysilane, tetraethoxysilane, dimethoxydiethoxysilane, methoxytriethoxysilane, butoxysilane, ethylbutoxysilane, phenoxysilane, methyltrimethoxysilane, dimethylmethoxysilane, trimethylmethoxysilane, methyltriethoxysilane, methyltripropoxysilane, ethyltrimethoxysilane, phenyltrimethoxysilane, tetra(methoxyethoxy)silane, tetra(ethoxyethoxy)silane, and dimethyldi (methoxyethoxy)silane. These alkoxysilanes can be used alone or in combination. It is also possible to condense a metal alkoxide such as tetraalkoxytitanium or tetraalkoxyzirconium, or a derivative of a metal alkoxide such as metal acetylacetone.

The hydrolysis and condensation reaction of the alkoxysilane are usually conducted in an organic solvent. Therefore, a known organic solvent is appropriately used as the solvent of the alkoxysilane solution, but is preferably a liquid having at least one hydroxyl group and an ether bond in the molecule, and more preferably a liquid having a boiling point of 100 to 300° C. Examples of the organic solvent include 3-methyl-3-methoxybutanol, 3-methyl-3-ethoxybutyl acetate, propylene glycol monomethyl ether, propylene glycol monomethyl ether acetate, dipropylene glycol monomethyl ether, tripropylene glycol monomethyl ether, propylene glycol mono-tert-butyl ether, isobutyl alcohol, isoamyl alcohol, ethyl cellosolve, ethyl cellosolve acetate, butyl cellosolve, butyl cellosolve acetate, methyl carbitol, methyl carbitol acetate, ethyl carbitol, and ethyl carbitol acetate. The amount of the organic solvent can be optionally selected and is preferably within a range from 0.5 to 3.0 parts by weight based on 1 part by weight of the alkoxysilane.

Usually, water and, if necessary, a hydrolysis catalyst are added to an alkoxysilane solution and, after a portion or all of alkoxy groups are hydrolyzed, condensation is conducted while removing an alcohol and water produced as by-products. Herein, the alcohol produced as by-products through the condensation reaction is an alcohol R'OH produced through decomposition of an alkoxysilane $[R_XSi(OR')_{4-X}]$. The solution also contains water added excessively for hydrolysis and water produced newly through the condensation reaction. Distillation of the alcohol and water may be conducted by a conventional distillation method, namely, heating of an alkoxysilane solution.

Water to be added to conduct the hydrolysis condensation reaction is preferably ion-exchange water and is preferably used in the amount of 1 to 4 mol per mol of the alkoxysilane. The hydrolysis catalyst used optionally is preferably an acid catalyst and, for example, hydrochloric acid, sulfuric acid, acetic acid, trifluoroacetic acid, phosphoric acid, boric acid and paratoluenesulfonic acid are preferably used.

It is also possible to partially modify with a polyimide or a polybenzooxazole by adding one or more kinds of tetracarboxylic dianhydride, or an active ester of a dicarboxylic acid, or a diamine, or a bisaminophenol upon the polymerization reaction. Furthermore, an acid component containing a silicon atom, or a diamine component may be added.

These reaction conditions are decided according to the constitution of the reaction system and is not specifically limited. The hydrolysis reaction preferably proceeds at 0 to 70° C. for 1 to 5 hours, while the condensation reaction preferably proceeds at 70 to 150° C. for 1 to 10 hours.

Furthermore, a preferable alkali-soluble resin is capable of polymer having a ring structure such as an imide ring an oxazole ring or the like. A polyamic acid or a poyamidate ester of a polyimide precursor, and a polyhydroxyamide of a polybenzooxazole precursor are preferable. The structure is shown in the following general formula (4). Heat resistance and solvent resistance of the polymer are remarkably improved having the ring structure.

[Chemical Formula 1]

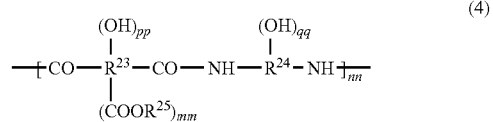

In the general formula (4), mm represents the number of a carboxyl group or an ester group, and represents an integer of 0 to 2, and is more preferably selected from an integer of 1 to 2. pp and qq of the general formula (4) represents the number of a hydroxyl group, and each represents an integer of 0 to 4 and satisfies the following relation: pp+qq>0. nn of the general formula (1) represents the number of a repeating structural unit of the polymer and is preferably within a range from 10 to 100,000.

In the general formula (4), $R^{23}$ represents a di- to octavalent organic group having two or more carbon atoms, and represents a structure component derived from an acid. Examples of the divalent organic group include residues of aromatic dicarboxylic acids such as terephthalic acid, isophthalic acid, diphenyletherdicarboxylic acid, naphthalenedicarboxylic acid, and bis(carboxyphenyl)propane; and aliphatic dicarboxylic acids such as cyclohexanedicarboxylic acid and adipic acid. Examples of the trivalent organic group include residues of tricarboxylic acids such as trimellitic acid and trimecic acid, and examples of the tetravalent organic group include residues of tetracarboxylic acids such as pyromellitic acid, benzophenonetetracarboxylic acid, biphenyltetracarboxylic acid, and diphenylethertetracarboxylic acid. In view of alkali solubility, pp preferably satisfies the following relation: pp>0 in the general formula (4). As the acid having such a structure, an acid having a hydroxyl group, such as hydroxyphthalic acid or hydroxytrimellitic acid can be used. These acid components may be used alone, or two or more kinds of them may be used in combination. It is preferred to copolymerize 1 to 40 mol % of a tetracarboxylic acid residue.

In the general formula (4), $R^{24}$ represents a di- to hexavalent organic group having two or more carbon atoms and represents a structure component derived from a diamine. Of these groups as for $R^{24}$, a group having an aromatic is preferable in view of heat resistance of the resulting polymer. In view of alkali solubility, qq preferably satisfies the following relation: qq>0, namely, the structure preferably has a hydroxyl group in the general formula (4). As an alkali-soluble group other than a hydroxyl group, a carboxyl group or a sulfonic acid group may be present. Specific examples of the diamine having such a structure include compounds such as bis(aminohydroxyphenyl)hexafluoropropane having a fluorine atom, and diaminodihydroxypyrimidine, diaminodihydroxypyridine, hydroxydiaminopyrimidine, diaminophenol, dihydroxybenzidine, diaminobenzoic acid, diaminoterephthalic acid each having no fluorine atom.

$R^{25}$ in the general formula (4) represents either hydrogen or an organic group having 1 to 20 carbon atoms. In view of solution stability of the resulting photosensitive resin solution, $R^{25}$ is preferably an organic group. In view of solubility in an aqueous alkali solution, hydrogen is preferable. In the present invention, a hydrogen atom and an alkyl group preferably coexist. Since a dissolution rate of to the aqueous alkali solution varies by controlling a ratio of hydrogen to the organic group of $R^{25}$, a photosensitive resin composition having a proper dissolution rate can be obtained. Preferably, the hydrogen atom accounts for 10 to mol % of $R^{25}$. When the number of carbon atoms of $R^{25}$ exceeds 20, solubility in the aqueous alkali solution deteriorates.

In the compound of the general formula (4), the structure component derived from an acid preferably has a structure represented by the general formula (5).

[Chemical Formula 2]

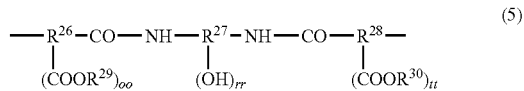

(5)

$R^{26}$ and $R^{28}$ may be the same or different and represent a di- to tetravalent organic group having 2 to 20 carbon atoms, and $R^{27}$ represents a tri- to hexavalent organic group having 3 to 20 carbon atoms and a hydroxyl group.

Also, $R^{29}$ and $R^{30}$ may be the same or different and represent either hydrogen or an organic group having 1 to 20 carbon atoms. When the number of carbon atoms of the organic group exceeds 20, solubility in an alkali developing solution deteriorates. oo and tt each represents an integer of 0 to 2, and is preferably selected from an integer of 1 to 2. rr represents an integer of 1 to 4. When rr is 5 or more, characteristics of the resulting heat-resistant resin film deteriorate.

In view of heat resistance of the resulting polymer, the acid component contains an aromatic ring more preferably. Particularly preferred structure includes, for example, trimellitic acid, trimecic acid, and naphthalenetricarboxylic acid residue. $R^{27}$ represents a tri- to hexavalent organic group having 3 to 20 carbon atoms. Furthermore, a hydroxyl group substituted on $R^{27}$ is preferably located adjacent to an amide bond. Examples of the diamine capable of producing such a structure include those in which an amino group of bis(3-amino-4-hydroxyphenyl)hexafluoropropane and bis(3-hydroxy-4-aminophenyl)hexafluoropropane each containing a fluorine atom, and bis(3-amino-4-hydroxyphenyl)propane, bis(3-hydroxy-4-aminophenyl)propane, 3,3'-diamino-4,4'-dihydroxybiphenyl, 3,3'-dihydroxy-4,4'-diaminobiphenyl, 2,4-diaminophenol, 2,5-diaminophenol and 1,4-diamino-2,5-dihydroxybenzene each containing no fluorine atom is bonded.

Examples of a preferable compound among the compound represented by the general formula (5) include, but are not limited to, those having the following structures. Also, H of COOH in the following formulas may be substituted with groups such as a methyl group, an ethyl group, a propyl group, a butyl group, a trifluoromethyl group, a trifluorochloro group, a pentafluoroethyl group, a perfluorobutyl group, a trifluorobutyl group, and a methoxyethyl group.

[Chemical Formula 3]

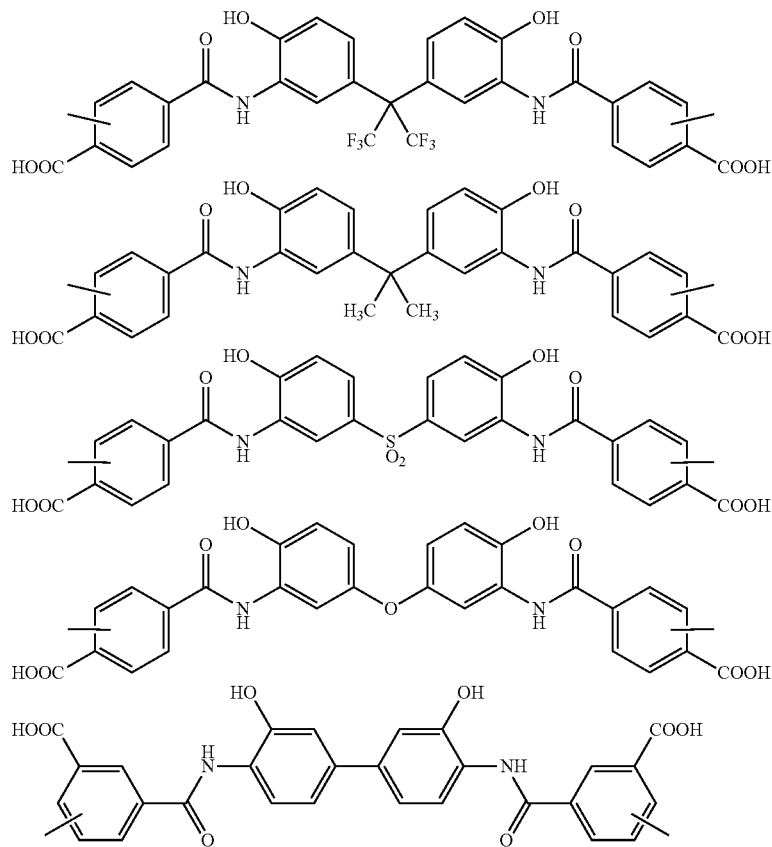

As long as solubility in an aqueous alkali solution, photosensitivity and heat resistance are not adversely affected, it is also possible to modify the acid component with tetracarboxylic acid or dicarboxylic acid each having no hydroxyl group. Examples thereof include aromatic tetracarboxylic acids such as pyromellitic acid, benzophenonetetracarboxylic acid, biphenyltetracarboxylic acid, diphenylethertetracarboxylic acid, and diphenylsulfonetetracarboxylic acid, and diester compounds thereof in which two carboxyl groups are replaced by a methyl group and an ethyl group; aliphatic tetracarboxylic acids such as butanetetracarboxylic acid and cyclopentanetetracarboxylic acid, and diester compounds thereof in which two carboxyl groups are replaced by a methyl group and an ethyl group; aromatic dicarboxylic acids such as terephthalic acid, isophthalic acid, diphenyletherdicarboxylic acid, and naphthalenedicarboxylic acid; and aliphatic dicarboxylic acids such as adipic acid. The modification degree is preferably 50 mol % or less, and more preferably 30 mol % or less, of the acid component. When the modification degree is more than 50 mol %, solubility in an aqueous alkali solution and photosensitivity may deteriorate.

In the general formula (4), a structure component derived from a diamine is preferably selected from structures represented by the following general formulas (6), (7) and (8):

[Chemical Formula 4]

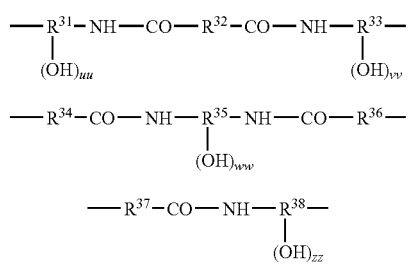

In the general formula (6), $R^{31}$ and $R^{33}$ may be the same or different and represent a tri- to tetravalent organic group having 2 to 20 carbon atoms and a hydroxyl group, and $R^{32}$ represents a divalent organic group having 2 to 30 carbon atoms. uu and vv each represents an integer of 1 or 2. In the general formula (7), $R^{34}$ and $R^{36}$ may be the same or different and represent divalent organic group having 2 to 20 carbon atoms, and $R^{35}$ represents a tri- to hexavalent organic group having 3 to 20 carbon atoms and a hydroxyl group. ww represents an integer of 1 to 4. In the general formula (8), $R^{37}$ represents a divalent organic group having 2 to 20 carbon atoms, and $R^{38}$ represents a tri- to hexavalent organic group having 3 to 20 carbon atoms and a hydroxyl group. zz represents an integer of 1 to 4.

In the general formula (6), $R^{31}$ and $R^{33}$ preferably have an aromatic ring in view of heat resistance of the resulting polymer. Specific examples thereof include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a bis(hydroxyphenyl)sulfone group, a hydroxydiphenylether group, and a dihydroxydiphenylether group. It is also possible to use aliphatic groups such as a hydroxycyclohexyl group and a dihydroxycyclohexyl group. $R^{32}$ preferably represents a divalent group having an aromatic in view of heat resistance of the resulting polymer, and examples thereof include a phenyl group, a biphenyl group, a diphenylether group, a diphenylhexafluoropropane group, a diphenylpropane group, and a diphenylsulfone group. In addition, an aliphatic cyclohexyl group can be used.

In the general formula (7), $R^{34}$ and $R^{36}$ preferably represent a divalent group having an aromatic in view of heat resistance of the resulting polymer, and examples thereof include a phenyl group, a biphenyl group, a diphenylether group, a diphenylhexafluoropropane group, a diphenylpropane group, and a diphenylsulfone group. In addition, an aliphatic cyclohexyl group can be used. $R^{35}$ preferably has an aromatic ring in view of heat resistance of the resulting polymer. Specific examples thereof include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a bis(hydroxyphenyl)sulfone group, a hydroxydiphenylether group, and a dihydroxydiphenylether group. It is also possible to use aliphatic groups such as a hydroxycyclohexyl group and a dihydroxycyclohexyl group.

In the general formula (8), $R^{37}$ preferably represents a divalent group having an aromatic in view of heat resistance of the resulting polymer, and examples thereof include a phenyl group, a biphenyl group, a diphenylether group, a diphenylhexafluoropropane group, a diphenylpropane group, and a diphenylsulfone group. In addition, an aliphatic cyclohexyl group can be used. $R^{38}$ preferably has an aromatic ring in view of heat resistance of the resulting polymer. Specific examples thereof include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a bis(hydroxyphenyl)sulfone group, a hydroxydiphenylether group, and a dihydroxydiphenylether group. It is also possible to use aliphatic groups such as a hydroxycyclohexyl group and a dihydroxycyclohexyl group.

Examples of a preferable compound among the compounds represented by the general formula (6) include, but are not limited to, those having the following structures, or those in which a portion of the benzene ring is substituted with a methyl group, an ethyl group, a trifluoromethyl group, an ester group, an amide group, or a fluorine atom.

[Chemical Formula 5]

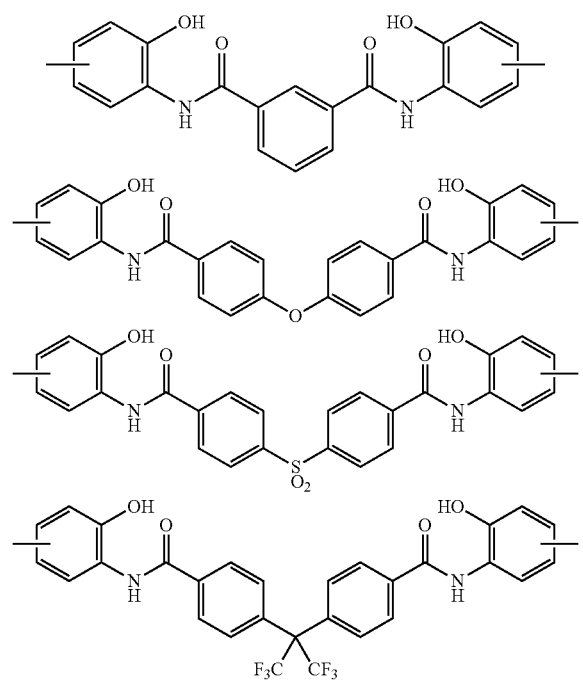

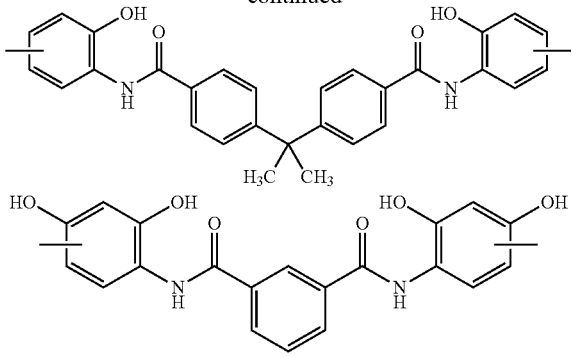
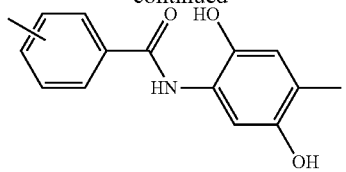

Examples of a preferable compound among the compounds represented by the general formula (7) include, but are not limited to, those having the following structures.

[Chemical Formula 6]

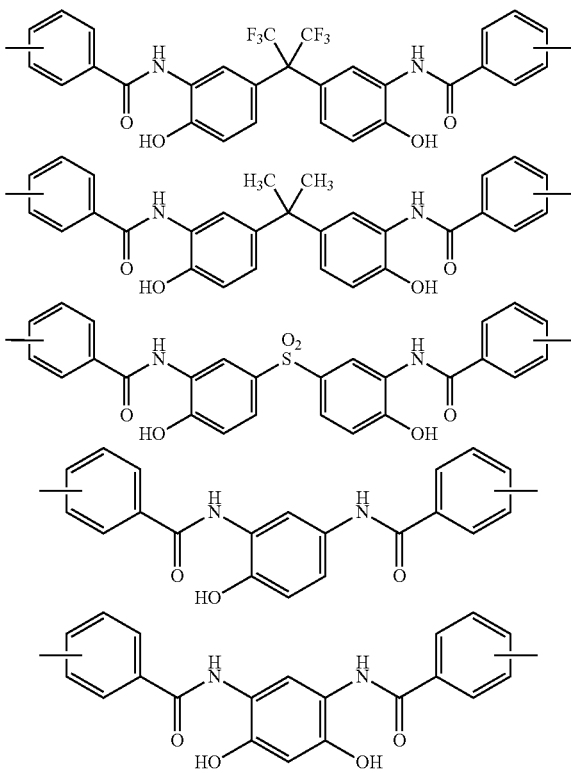

Examples of a preferable compound among the compounds represented by the general formula (8) include, but are not limited to, those having the following structures.

[Chemical Formula 7]

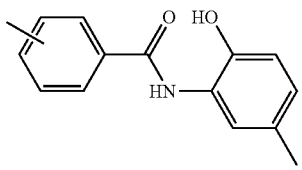

In the general formula (6), (7) and (8), it is also possible to modify with the other diamine component in the proportion within a range from 1 to 40 mol % based on the diamine. Examples of the other diamine component include phenylenediamine, diaminodiphenylether, aminophenoxybenzene, diaminodiphenylmethane, diaminodiphenylsulfone, bis(trifluoromethyl)benzidine, bis(aminophenoxyphenyl)propane, bis(aminophenoxyphenyl)sulfone, or compounds in which the aromatic ring thereof is substituted with an alkyl group or a halogen atom, aliphatic cyclohexyldiamine, methylenebiscyclohexylamine, and hexamethylenediamine. When such an aliphatic diamine component is copolymerized in the proportion of more than 40 mol %, heat resistance of the resulting polymer deteriorates, and thus the proportion of copolymerization is preferably 40 mol % or less.

It is also possible to use, as a heat-resistant polymer precursor resemblance to a polyamic acid, a polyhydroxyamide in place of the polyamic acid. Such a polyhydroxyamide can be obtained by a condensation reaction of a bisaminophenol compound and a dicarboxylic acid. Specific examples of the method of the reaction include a method of reacting a dehydration condensing agent such as dicyclohexylcarbodiimide with an acid and adding a bisaminophenol compound, and a method of adding dropwise a solution of a dicarboxylic acid dichloride to a solution of a bisaminophenol compound, the solution containing a tertiary amine such as pyridine added therein.

When a polyhydroxyamide is used, it is possible to obtain a positive photosensitive resin composition capable of removing the area exposed to ultraviolet ray using an aqueous alkali solution by adding a photosensitizer such as a naphthoquinonediazide sulfonate ester to a solution of the polyhydroxyamide.

Furthermore, an acid or diamine component of the general formula (4) may be copolymerized with an aliphatic group having a siloxane structure so as to improve the adhesion property to a substrate as long as heat resistance is not deteriorated. Specific examples of the diamine component include those obtained by copolymerizing with bis(3-aminopropyl)tetramethyldisiloxane or bis(p-aminophenyl)octamethylpentasiloxane in the proportion of 1 to 10 mol %.

The alkali-soluble resin of the present invention may be only composed of a structural unit represented by the general formula (4), or may be a copolymer or a blend with the other structural unit.

It is also possible to react a terminal sealing agent with a terminal of a polymer of the general formula (4). As the terminal sealing agent, a monoamine, an acid anhydride, a monocarboxylic acid, a monoacid chloride compound and a monoactive ester compound can be used. It is preferred because a molecular weight can be controlled to a preferable range by reacting with the terminal sealing agent. Also, various organic groups as a terminal group can be introduced by reacting with the terminal sealing agent.

Examples of the monoamine used in the terminal sealing agent include, but are not limited to, aminohydroxyquinoline, hydroxyaminonaphthalene, carboxyaminonaphthalene, aminonicotinic acid, aminosalicylic acid, aminotoluic acid, ammelide, aminobenzoic acid, aminobenzenesulfonic acid, 3-aminobenzenesulfonic acid, aminodihydroxypyrimidine, aminophenol, aminomercaptoquinoline, mercaptoaminonaphthalene, aminodimercaptopyrimidine, aminothiophenol, ethynylaniline, diethynylaniline, ethynylaminonaphthalene, and diethynylaminonaphthalene.

Preferred examples among these monoamines are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline, and 3,5-diethynylaniline.

Examples of the compound selected from an acid anhydride, a monocarboxylic acid, a monoacid chloride compound and a monoactive ester compound used as the terminal sealing agent include acid anhydrides such as phthalic anhydride, maleic anhydride, nadic anhydride, cyclohexanedicarboxylic anhydride, and 3-hydroxyphthalic anhydride; monocarboxylic acids such as carboxyphenol, carboxythiophenol, hydroxycarboxynaphthalene, mercaptocarboxynaphthalene, carboxybenzenesulfonic acid, ethynylbenzoic acid, diethynylbenzoic acid, and ethynylnaphthoic acid, and monoacid chloride compounds in which a carboxyl group thereof is acid-chlorinated; monoacid chloride compounds in which only a monocarboxyl group of dicarboxylic acids such as terephthalic acid, phthalic acid, maleic acid, cyclohexanedicarboxylic acid, 3-hydroxyphthalic acid, 5-norbornene-2,3-dicarboxylic acid, and dicarboxynaphthalene is acid-chlorinated; and active ester compounds obtained by reacting a monoacid chloride compound with N-hydroxybenzotriazole or N-hydroxy-5-norbornene-2,3-dicarboxylmide.

Examples of a preferable compound among these compounds include acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid, and 3,5-diethynylbenzoic acid; monoacid chloride compounds in which a carboxyl group thereof is acid-chlorinated; monoacid chloride compounds in which only a monocarboxyl group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene is acid-chlorinated; and active ester compounds obtained by reacting a monoacid chloride compound with N-hydroxybenzotriazole or N-hydroxy-5-norbornene-2,3-dicarboxylmide.

The proportion of the monoamine to be introduced in the terminal sealing agent is preferably within a range from 0.1 to 60 mol %, and particularly preferably from 5 to 50 mol %, based on the entire amine component. The proportion of the compound, selected from an acid anhydride, a monocarboxylic acid, a monoacid chloride compound and a monoactive ester compound used as the terminal sealing agent, to be introduced is preferably within a range from 0.1 to 100 mol %, and particularly preferably from 5 to 90 mol %, based on the diamine component. A plurality of different terminal groups may be introduced by reacting a plurality of terminal sealing agents.

The terminal sealing agent introduced into the polymer can be easily detected by the following method. For example, the terminal sealing agent can be easily detected by dissolving the polymer, into which the terminal sealing agent has been introduced, in an acidic solution, thereby decomposing into an amine component and an acid anhydride component as structural units of the polymer, and measuring them using gas chromatography (GC) or NMR. Alternatively, the terminal sealing agent can be easily detected by directly measuring the polymer component, into which the terminal sealing agent has been introduced, using pyrolysis gaschromatograph (PGC), infrared spectrum or $C^{13}$NMR spectrum.

The polymer containing structural unit represented by the general formula (4) as a main component is synthesized by the following method. The polyamic acid or poyamidate ester can be synthesized, for example, by a method of reacting a tetracarboxylic dianhydride with a diamine compound at low temperature, a method of obtaining a diester from a tetracarboxylic dianhydride and an alcohol and reacting the diester with an amine in the presence of a condensing agent, and a method of obtaining a diester from a tetracarboxylic dianhydride and an alcohol, followed by an acid chlorination of the resulting dicarboxylic acid and further a reaction with an amine.

The polyhydroxyamide can be obtained by a condensation reaction of a bisaminophenol compound and a dicarboxylic acid. Specific examples of the method include a method of reacting a dehydration condensing agent such as dicyclohexylcarbodiimide (DCC) with an acid and adding a bisaminophenol compound, and a method of adding dropwise a solution of a dicarboxylic acid dichloride to a solution of a bisaminophenol compound, the solution containing a tertiary amine such as pyridine.

The resin composition of the present invention contains (b) a silicon compound having a secondary aromatic amino group and an alkoxy group. As used herein, the silicon compound means a compound containing a silicon atom in the molecule. When the resin composition contains, in addition to the alkali-soluble resin (a), the silicon compound having a secondary aromatic amino group and an alkoxy group (b), the adhesion property of the composition after curing to a silicone substrate, ceramic or metal can be enhanced without adversely affecting the photosensitive component. Surprisingly, the effect of improving the adhesion property of the composition after development to a substrate is also exerted. Namely, the silicon compound (b) serves as an adhesion promoter.

The content of the silicon compound (b) is preferably from 0.01 to 100 parts based on 100 parts of the alkali-soluble resin. Such a silicon compound is preferably selected from compounds represented by the following general formulas (1) to (3). It is also possible to use any compound as long as it contains a silicon compound having a secondary aromatic amino group and an alkoxy group in a molecule. Specifically, such a compound can be obtained by reacting an aromatic amine compound with an alkoxysilane compound capable of reacting with an amino group such as an epoxy group or a chloromethyl group. The compound is preferably an adduct of an aromatic amine and an epoxysilane compound. When compounds represented by the general formulas (1) to (3) have a secondary aromatic amino group, a composition having the adhesion property to a substrate can be obtained without causing a decrease of activity of an aromatic amino group and acceleration of decomposition of a photosensitive component as compared with a primary aromatic amino group.

A silanol group on the surface of a silicone substrate and a secondary amino group of the compounds represented by the general formulas (1) to (3) react even at a low temperature of 50 to 200° C. Furthermore, an alkoxy group of the compounds represented by the general formulas (1) to (3) can be combined with a silanol group on the surface of the silicone substrate to form a siloxane bond, but a catalytic action of the secondary amino group accelerates formation of the bond. As a result, adhesion force between the composition and the silicone substrate increases. Also, when silicone nitride, silicon chloride or ceramics is used as the material of the substrate, the same effect can be obtained because it reacts with the silanol group on the surface. Also, when iron, nickel or copper are used as the material of the substrate, good adhesion property can be obtained because it reacts with an OH group (a hydroxyl group) formed on a thin layer of a metal oxide formed on the surface. Also, the secondary amino group of the compound represented by the general formulas (1) to (3) does not exert an adverse influence on a photosensitive component which is likely to be adversely affected by an amino group because a large substituent is bonded. Thus, it is possible to exhibit excellent storage stability.

[Chemical Formula 8]

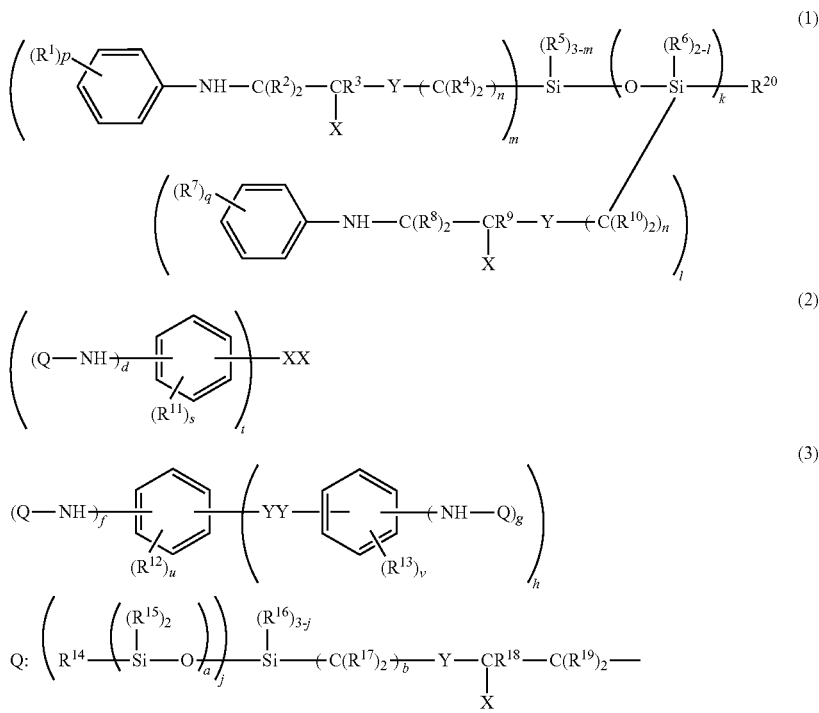

In the above formulas, $R^1$, $R^7$, $R^{11}$, $R^{12}$ and $R^{13}$ each represents a group selected from an organic group having 1 or more and 10 or less carbon atoms, a hydroxyl group, a nitro group, an amino group and a carboxyl group. $R^2$, $R^3$, $R^4$, $R^8$, $R^9$, $R^{10}$, $R^{17}$, $R^{18}$ and $R^{19}$ each represents a group selected from a hydrogen atom, an alkyl group having 1 to 6 carbon atoms, an alkenyl group, a phenyl group and a substituted phenyl group. Of these groups, $R^2$ and $R^4$, $R^8$ and $R^{10}$, or $R^{17}$ and $R^{19}$ each may be combined to form an aliphatic cyclic structure. $R^5$, $R^6$ and $R^{20}$ each represents a group selected from an alkyl group having 1 to 6 carbon atoms, an alkenyl group, a phenyl group, a substituted phenyl group and an alkoxy group having 1 to 6 carbon atoms, at least one of which is an alkoxy group having 1 to 6 carbon atoms. $R^{14}$, $R^{15}$ and $R^{16}$ each represents an organic group selected from an alkyl group having 1 to 6 carbon atoms, an alkenyl group, a phenyl group, a substituted phenyl group and an alkoxyl group having 1 to 6 carbon atoms, at least one of which is an alkoxy group having 1 to 6 carbon atoms. X represents a group selected from an alkyl group having 1 to 10 carbon atoms, an alkenyl group, a nitro group, a hydroxyl group, an alkoxyl group, a carboxyl group, an ester group having 2 to 10 carbon atoms and an amide group having 2 to 10 carbon atoms. Y represents a group selected from a single bond, a phenyl group and a —CH$_2$O— group. XX and YY each represents a group selected from a single bond and:

[Chemical Formula 9]

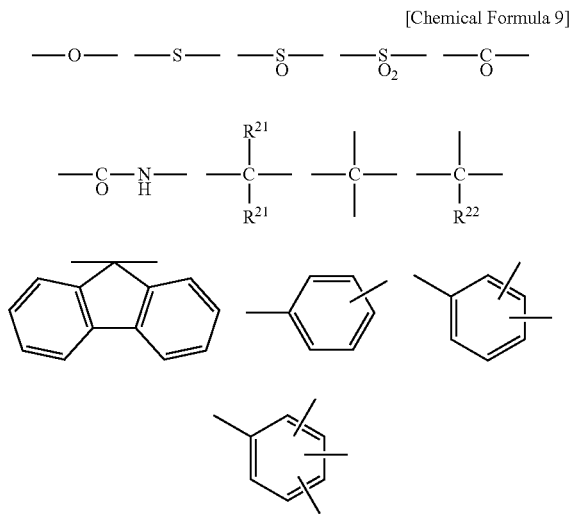

R$^{21}$ and R$^{22}$ each represents a group selected from hydrogen, fluorine, an alkyl group having 1 to 10 carbon atoms, a fluorinated alkyl group having 1 to 10 carbon atoms and an alkoxy group having 1 to 10 carbon atoms. p, q, s, u and v each represents an integer of 1 to 4, m represents an integer of 1 to 3, l represents an integer of 0 to 2, a, b, k and n each represents an integer of 0 to 10, d, f and g each represents an integer of 1 to 4, and t and h each represents an integer of 1 to 100. j represents an integer of 1 to 3. R$^1$ to R$^{22}$ may be the same or different when a plurality of R$^1$(s) to R$^{22}$(s) exist in a molecule.

R$^1$ and R$^7$ preferably represent a hydrogen atom, an alkyl group such as a methyl group, an ethyl group, a propyl group, or a butyl group, a fluorinated alkyl group such as a trifluoromethyl group, a pentafluoroethyl group, a perfluoropropyl group, or a perfluorobutyl group, a hydroxyl group, a nitro group, a carboxyl group, an amino group, an ester group having 2 to 10 carbon atoms, or an amide group having 2 to 10 carbon atoms. Of these groups, an alkyl group, a fluorinated alkyl group or a hydroxyl group is preferable.

R$^2$, R$^3$, R$^4$, R$^8$, R$^9$, R$^{10}$, R$^{17}$, R$^{18}$ and R$^{19}$ preferably represent a methyl group, an ethyl group, a propyl group, or a phenyl group. Also, R$^2$ and R$^4$, R$^8$ and R$^{10}$, or R$^{17}$ and R$^{19}$ are preferably combined to form a cyclopentane ring, a cyclohexane ring or a cycloheptane ring.

R$^5$, R$^6$ and R$^{20}$ represent a methyl group, an ethyl group, a propyl group, a phenyl group, a methoxy group, an ethoxy group, a propoxy group, or a butoxy group, at least one of which is preferably an alkoxyl group such as a methoxy group, an ethoxy group, a propoxy group, or a butoxy group. X is particularly preferably an alkoxyl group such as a hydroxyl group, a methoxy group, an ethoxy group, a propoxy group, or a butoxy group, or a nitro group.

The aromatic amine used in the compounds represented by the general formulas (1) to (3) is preferably an aromatic amine having pKa (a dissociation constant in an aqueous solution) within a range from 3 to 9. When pKa is less than 3, the adhesion property to a substrate decreases. In contrast, when pKa is more than 9, decomposition of the photosensitive component is accelerated. pKa is more preferably within a range from 4 to 8. Examples of the amine include aromatic amines such as aniline, cyanoaniline, hydroxyl aniline, nitroaniline, chloroaniline, aminobenzoic acidethyl, trifluoromethylaniline, methylaniline, dimethylaniline, methylhydroxylaniline, aminopyridine, methylaminopyridine, dihydroxyaniline, and hydroxyaminopyridine; or aromatic polyhydric amines such as diaminobenzene, triaminobenzene, diaminopyridine, triaminopyridine, hydroxydiaminobenzene, and dihydroxydiaminobenzene.

These aromatic amines are reacted with a silane coupling agent capable of reacting with an amino group. Examples of a preferable group capable of reacting with the amino group include an epoxy group and a chloromethyl group. It is not preferred to use, as the group capable of reacting with the amino group of aromatic amines, a carboxyl group or a sulfonic acid group because basicity of the amino group is completely lost and sometimes serves as an acid. As described above, examples of the silane compound include trimethoxy-1-dimethylenechloride, trimethoxyepoxysilane, triethoxyepoxysilane, carboxylpropyltrimethoxysilane, bis(epoxy)tetramethoxydisiloxane, tris(epoxy)trimethoxydisiloxane, and tris(epoxy)penta(methoxy)trisiloxane.

The compound represented by the general formula (2) can be obtained by reacting an aromatic amine compound having two or more amino groups with a silane coupling agent having a group capable of reacting with the amino group.

Examples of the aromatic amine compound having two or more amino groups include an aromatic diamine compound having two amino groups, an aromatic triamine compound having three amino groups, an aromatic tetraamine compound having four amino groups. The aromatic amine compound preferably has pKa within a range from 3 to 9. Examples of the aromatic diamine compound include substituted or non-substituted aromatic diamines such as phenylenediamine, methylphenylenediamine, cyanophenylenediamine, hydroxyphenylenediamine, diaminodiphenylmethane, diaminodiphenylether, diaminobiphenyl, dimethyldiaminobiphenyl, dimethoxydiaminobiphenyl, bis(trifluoromethyl)diaminobiphenyl, bis(aminophenoxy)benzene, bis(aminohydroxyphenyl)propane, bis(aminophenyl)dipropylbenzene, bis(aminophenoxy)diphenylether, bis(aminophenoxy)diphenylsulfone, bis(aminophenoxy)diphenylpropane, bis(aminohydroxyphenyl)hexafluoropropane, bis(aminohydroxyphenyl)propane, bis(aminohydroxyphenyl)sulfone, and bis(aminophenoxyphenyl)ether. It is particularly preferred to use a diamine having a phenolic hydroxyl group.

Examples of the aromatic amine compound having three or more amino groups include tri(aminophenyl)methane, tri(aminophenyl)ethane, tri(aminophenyl)propane, tetra(aminophenyl)methane, tri(aminophenyl)trifluoroethane, and a triamine compound containing a substituent such as a nitro group, an ester group or an alkyl group, and a tetraamine compound such as tetra(aminophenyl)methane.

The compound represented by the general formula (3) can be obtained by reacting an aromatic diamine, a triamine, or a tri- or higher polyvalent polyamine with a silane coupling agent having a group capable of reacting with an amino group.

Specific examples of preferable compounds represented by the general formula (1) to (3) include, but are not limited to, the following compounds.

[Chemical Formula 10]
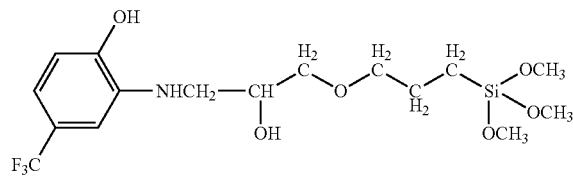
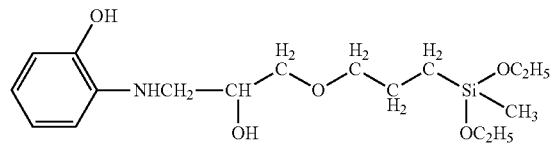
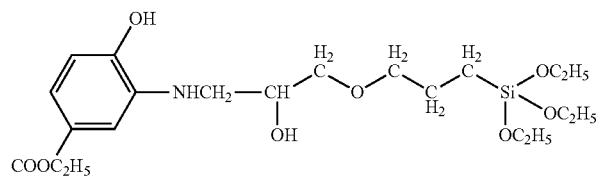
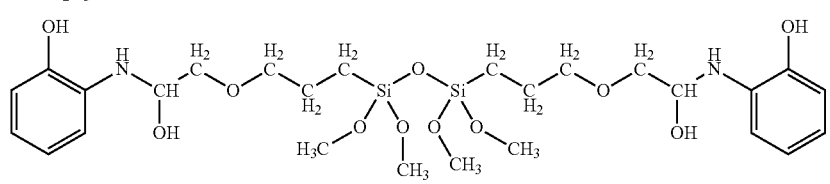
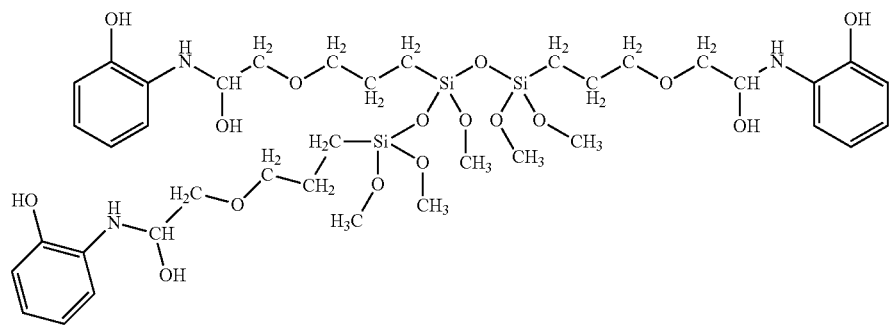
[Chemical Formula 11]
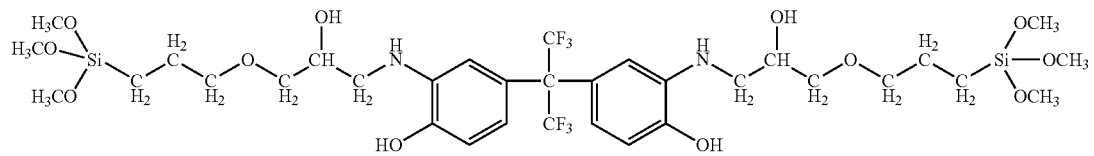
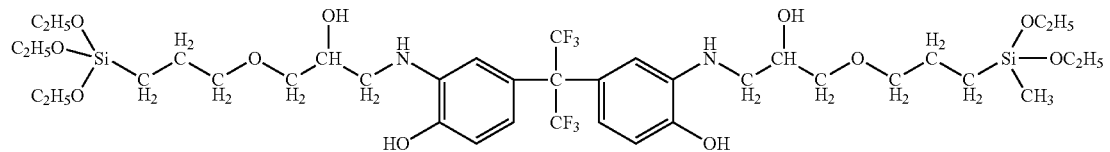
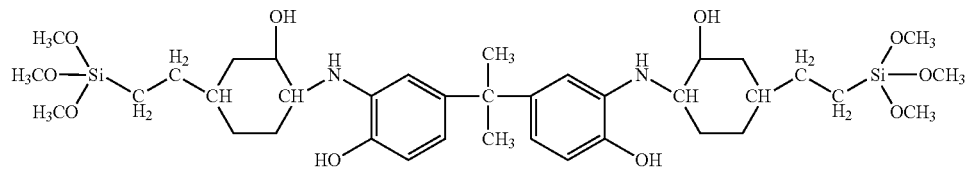

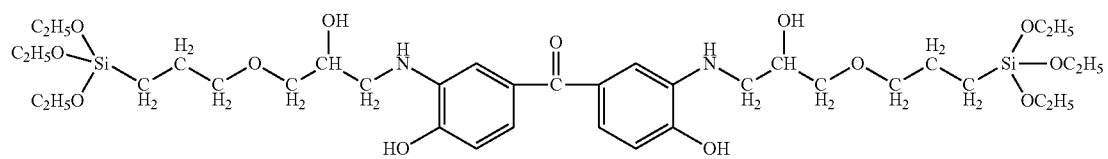
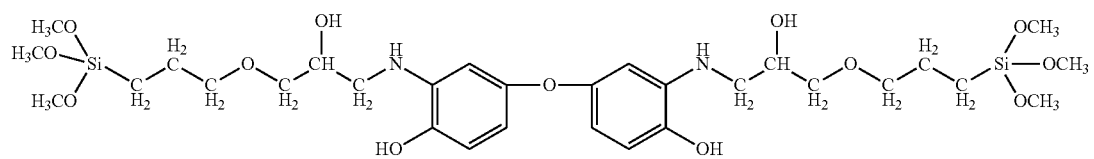
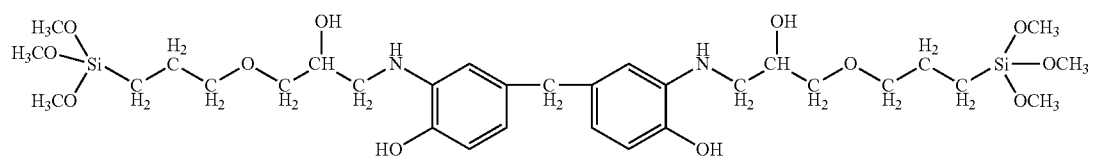
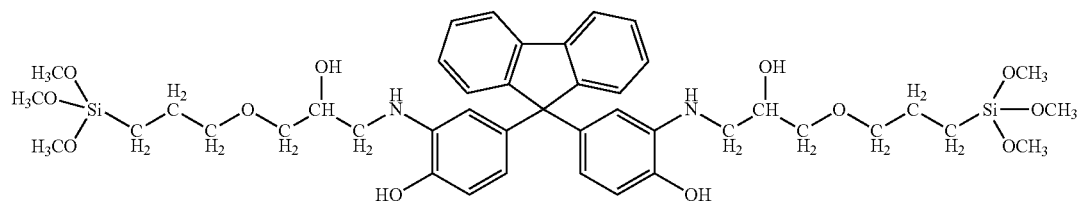
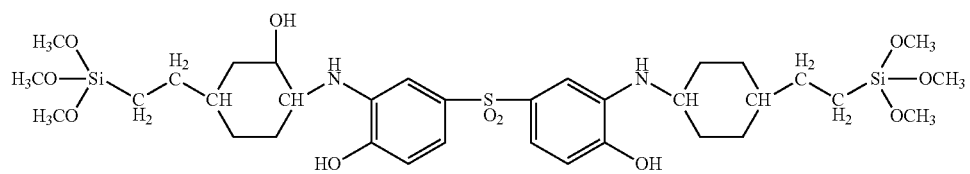
[Chemical Formula 12]
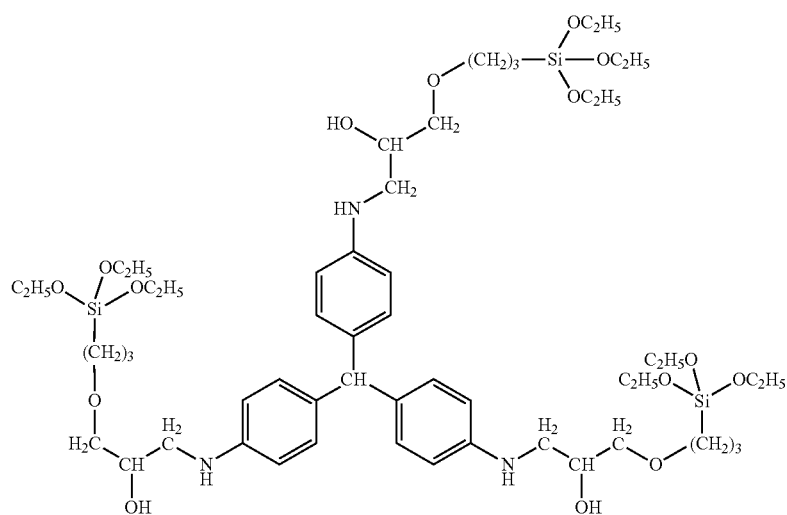

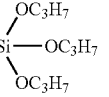
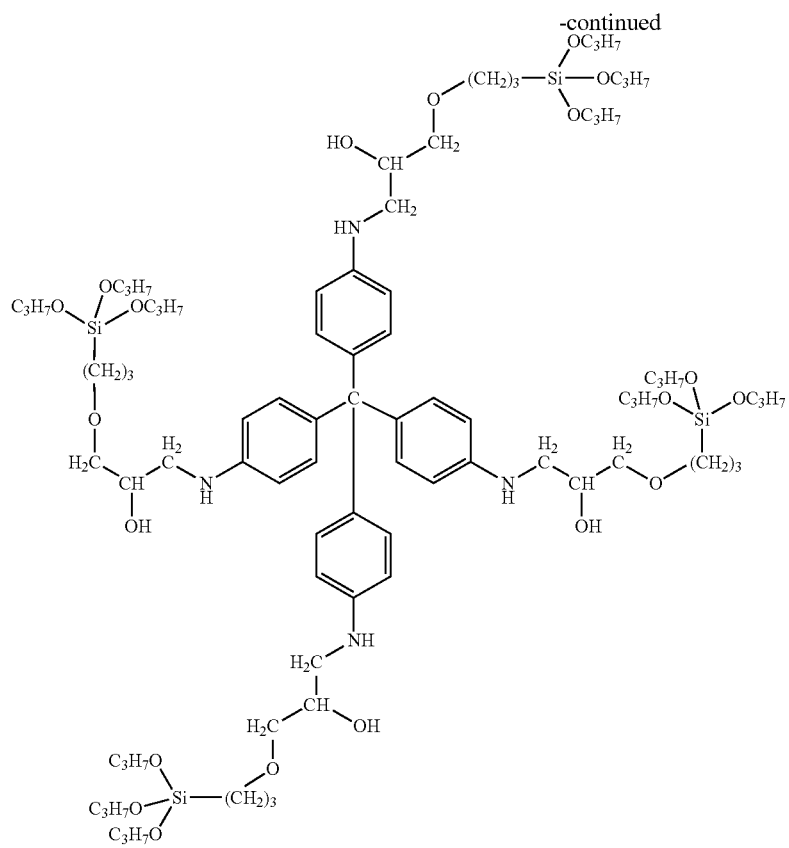

The compounds represented by the general formulas (1) to (3) can be obtained by mixing an aromatic amine with a silane coupling agent with or without a solvent and reacting the mixture at a temperature within a range from −20 to 150° C. for one minute to one week. At this time, regarding a mixing ratio of the aromatic amine to the silane coupling agent, the proportion of the silane coupling agent is preferably within a range from 10 to 400 mol %, more preferably from 50 to 200 mol %, and still more preferably from 60 to 150 mol %, based on 100 mol % of the entire amino group amount. When the proportion of the silane coupling agent is less than 10 mol % based on 100 mol % of the aromatic amine, less effect of improving adhesion is exerted. When the proportion of the silane coupling agent is more than 400 mol %, the reaction such as gelation occurs and the product becomes unstable. It is also possible to terminate the reaction at low temperature or the reaction for a short reaction time, storage stability is poor. When the solvent is not added, stability of the reaction product may deteriorate and thus it is preferred to react in a solution of a concentration of 1 to 90%.

It is also possible to add, as a catalyst, organic acids having 1 to 10 carbon atoms such as formic acid, acetic acid, and oxalic acid, acid compounds such as sulfuric acid, hydrochloric acid, and phosphoric acid, or amines having 1 to 10 carbon atoms such as triethylamine and pyridine, and bases such as sodium hydroxide, potassium hydroxide, and sodium carbonate. The amount of these catalysts is preferably from 0.0001 to 10 parts by weight based on 100 parts by weight of the total weight of the aromatic amine and the silane compound.

In view of solubility and stability of the resulting adhesion promoter, it is possible to dilute with at least one solvent selected from alcohols having 1 to 7 carbon atoms, esters having 2 to 20 carbon atoms, ketones having 3 to 20 carbon atoms, amides having 3 to 20 carbon atoms, and a sulfur-containing solvent having 3 to 20 carbon atoms. Stability of the solution can be enhanced by diluting with these solvents. The amount of the solvent to be added is preferably from 1 to 10,000 parts by weight, and more preferably from 10 to 1,000 parts by weight, based on 100 parts by weight of the compounds of the general formulas (1) to (3). When the amount is less than 1 part by weight, the addition effect is not exerted. In contrast, when the amount is more than 100,000 parts by weight, the amount of the solution to be added to a varnish increases and the non-volatile component and viscosity of the varnish decrease, unfavorably. Specific examples of the solvent include alcohols such as ethanol, propanol, butanol, and methoxymethylbutanol; esters such as ethyl acetate, propylene glycol monomethyl ether acetate, ethyl lactate, and propylene carbonate; ethers such as propylene glycol monomethyl ether and tetrahydrofuran; and N-methyl-2-pyrrolidone, dimethylacetamide, dimethylimidazoline, and dimethyl sulfoxide.

The resin composition of the present invention contains at least one selected from a photopolymerization initiator, a photo acid generator and a photo base generator (c) so as to impart photosensitivity.

Furthermore, when a photopolymerization initiator is used, it is possible to easily obtain a negative photosensitive resin composition in which the light irradiated area is insolubilized by adding polymerizable compounds such as an acrylic compound, a vinyl compound and an acetylene compound.

It is also possible to obtain a positive photosensitive resin composition in which the light irradiated area is dissolved by adding a photo acid generator to generate an acid at the light irradiated area, resulting in an increase of solubility in an aqueous alkali solution of the light irradiated area. It is also possible to obtain a negative relief pattern in which the light irradiated area is insolubilized by adding a photo acid generator or a photo base generator and an epoxy compound, and thus an acid or a salt group generated at the light irradiated area accelerates the reaction of the epoxy compound.

Examples of a preferable photopolymerization initiator as the component (c) include Michler's ketone, benzoine methyl ether, benzoine ethyl ether, benzoine isopropyl ether, 2-t-butylanthraquinone, 2-ethylanthraquinone, 4,4-bis(diethylamino)benzophenone, acetophenone, benzophenone, thioxanthone, 2,2-dimethoxy-2-phenylacetophenone, 1-hydroxycyclohexyl phenyl ketone, 2-methyl-[4-(methylthio)phenyl]-2-morpholino-1-propanone, benzyl, diphenyl disulfide, phenanthrenequinone, 2-isopropylthioxanthone, riboflavin tetrabutyrate, 2,6-bis(p-diethylaminobenzal)-4-methyl-4-azacyclohexanone, N-ethyl-N-(p-chlorophenyl) glycine, N-phenyldiethanolamine, 2-(o-ethoxycarbonyl) oxyiminopropan-1-one, 3,3,4,4-tetra(t-butylperoxycarbonyl)benzophenone, 3,3-carbonylbis(7-diethylaminocumarin), bis(cyclopentadienyl)-bis-[2,6-difluoro-3-(pyrr-1-yl)phenyl]titanium, and a hexaallylbiimidazole compound. These photopolymerization initiators may be used alone, or two or more kinds of them may be used in combination. The amount of these photoinitiators is preferably from 1 to 40 parts by weight based on 100 parts by weight of the alkali-soluble resin.

Examples of the photo acid generator include a quinonediazide compound, a sulfonium salt, a phosphonium salt, a diazonium salt, and an iodonium salt.

Examples of the quinonediazide compound include those obtained by ester bonding of sulfonic acid of quinonediazide to a polyhydroxy compound, those obtained by sulfonamide bonding of sulfonic acid of quinonediazide to a polyamino compound, and those obtained by ester bonding and/or sulfonamide bonding of sulfonic acid of quinonediazide to a polyhydroxypolyamino compound. All functional groups of these polyhydroxy and polyamino compounds may not be substituted with quinonediazide, and 50 mol % or more of functional groups are preferably substituted with quinonediazide. When the proportion is less than 50 mol %, solubility in an alkali developing solution excessively increases and thus contrast with the unexposed area may not be obtained and a desired pattern may not be obtained. It is possible to obtain a photosensitive resin composition, which is sensitive to conventional ultraviolet ray such as i-line (365 nm), h-line (405 nm) and g-line (436 nm) of a mercury lamp, by using such a quinonediazide compound. Two or more kinds of these compounds are preferably used in combination. By using two or more kinds of photo acid generators, a ratio of a dissolution rate between the exposed area and the unexposed area can increase, and thus a photosensitive resin composition having high sensitivity can be obtained.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, all of which are manufactured by Honshu Chemical Industry Co., Ltd.); BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, all of which are manufactured by Asahi Organic Chemicals Industry Co., Ltd.); and 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate ester, bisphenol A, bisphenol E, methylenebisphenol, and Bis P-AP (trade names, all of which are manufactured by Honshu Chemical Industry Co., Ltd.).

Examples of the polyamino compound include, but are not limited to, 1,4-phenylenediamine, 1,3-phenylenediamine, 4,4'-diaminodiphenylether, 4,4'-diaminodiphenylmethane, 4,4'-diaminodiphenylsulfone, and 4,4'-diaminodiphenyl sulfide.

Examples of the polyhydroxypolyamino compound include, but are not limited to, 2,2-bis(3-amino-4-hydroxyphenyl)hexafluoropropane and 3,3'-dihydroxybenzidine.

In the present invention, both quinonediazide having a 5-naphthoquinonediazidesulfonyl group and quinonediazide having a 4-naphthoquinonediazidesulfonyl group are preferably used. A 4-naphthoquinonediazidesulfonyl ester compound has an absorption in an i-line range of a mercury lamp and is suited for i-line exposure. A 5-naphthoquinonediazidesulfonyl ester compound has an absorption extending into a g-line range of a mercury lamp and is suited for g-line exposure. It is preferred to select the 4-naphthoquinonediazidesulfonyl ester compound or 5-naphthoquinonediazidesulfonyl ester compound according to an exposure wavelength. It is also possible to obtain a naphthoquinonediazidesulfonyl ester compound in which a 4-naphthoquinonediazidesulfonyl group and a 5-naphthoquinonediazidesulfonyl group are used in combination in the same molecule, and to use the 4-naphthoquinonediazidesulfonyl ester compound in combination with the 5-naphthoquinonediazidesulfonyl ester compound.

When the molecular weight of the quinonediazide compound is more than 5,000, the quinonediazide compound is not sufficiently thermolyzed in the subsequent heat treatment, thus causing problems such as deterioration of heat resistance, mechanical properties and adhesion property of the resulting film. From such a point of view, the molecular weight of the quinonediazide compound is preferably from 300 to 3,000, and more preferably from 350 to 1,500.

The amount of the quinonediazide compound to be added is preferably 1 or more and 50 or less parts by weight, and more preferably 3 or more and 40 or less parts by weight, based on 100 parts by weight of the alkali-soluble resin.

The quinonediazide compound is synthesized by the following method. The method includes, for example, a method of reacting 5-naphthoquinonediazidesulfonyl chloride with a phenol compound in the presence of triethylamine. The method of synthesizing a phenol compound includes a method of reacting an α-(hydroxyphenyl)styrene derivative with a polyhydric phenol compound in the presence of an acid catalyst.

A photo acid generator capable of properly stabilize an acid component generated by the exposure among the photo acid generators used as the component (c) used in the present invention is preferably a compound selected from a sulfonium salt, a phosphonium salt and a diazonium salt. Since a resin film obtained from the photosensitive resin composition of the present invention is used as a permanent film, it is not preferred from an environmental point of view that phosphorus is remained. It is necessary to consider a color tone of the film, a sulfonium salt is preferably used. Of the sulfonium salt, those having structures represented by the general formulas (18) to (20) are preferably used.

[Chemical Formula 13]

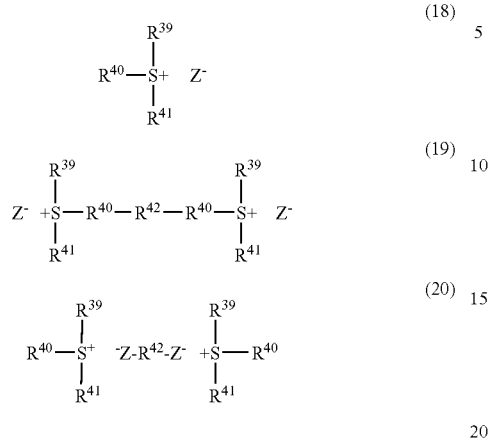

In the general formula (18) to (20), $R^{39}$ to $R^{41}$ may be the same or different and represent an organic group having 1 to 20 carbon atoms. $R^{42}$ represents a single bond or an organic group having 1 to 20 carbon atoms. $Z^-$ represents an anion moiety selected from $R^{43}SO_2^-$, $R^{43}COO^-$ and $SbF_6^-$. $R^{43}$ represents an organic group having to 20 carbon atoms. Specific examples of the sulfonium salt represented by the general formula (18) include, but are not limited to, the followings.

[Chemical Formula 14]

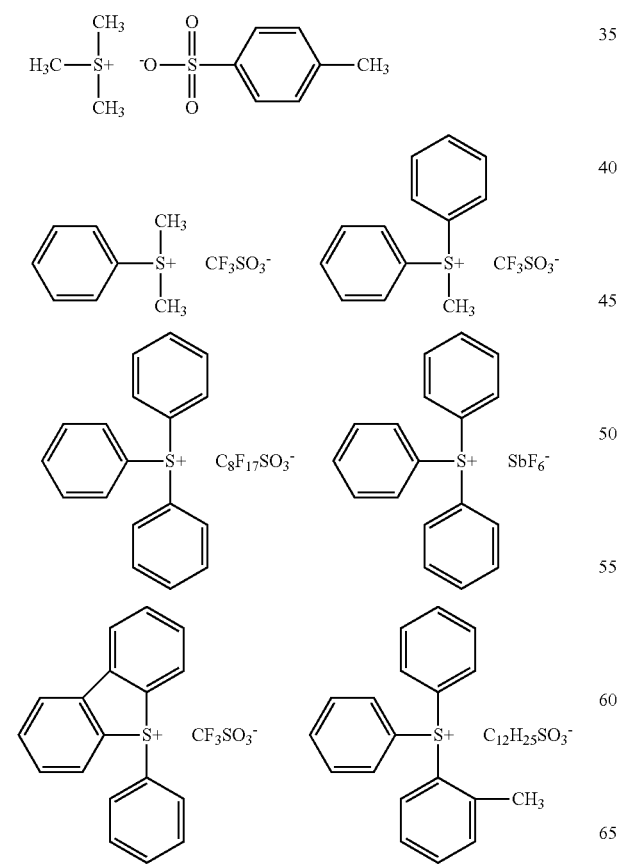

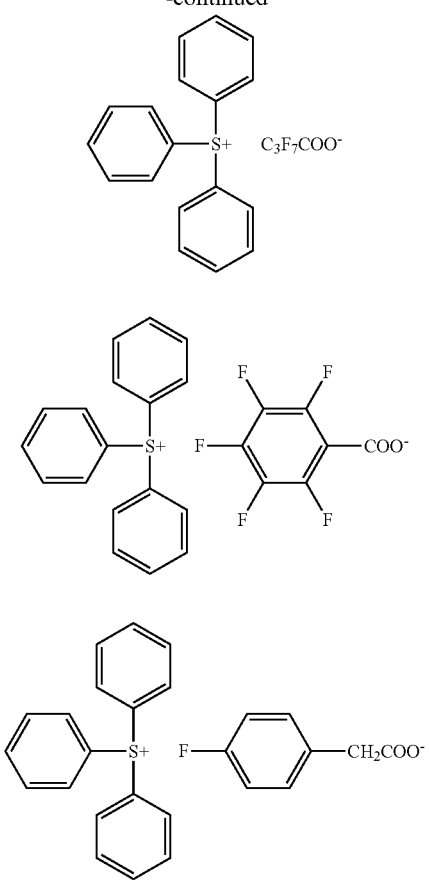

-continued

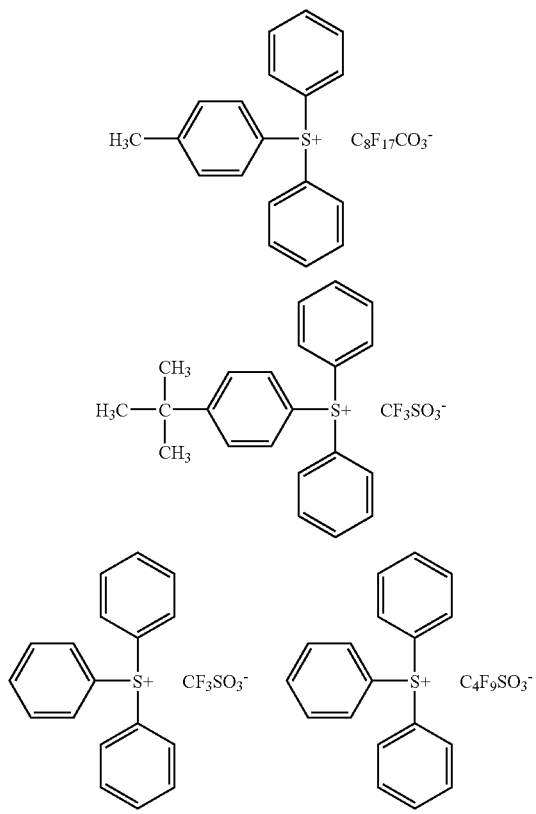

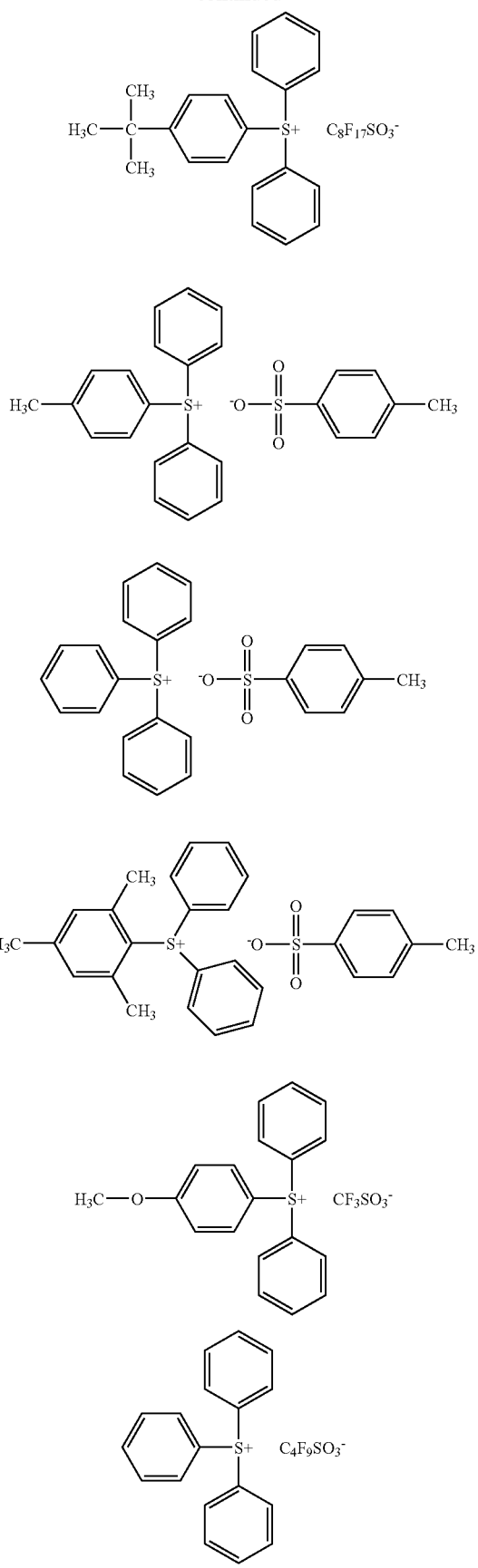
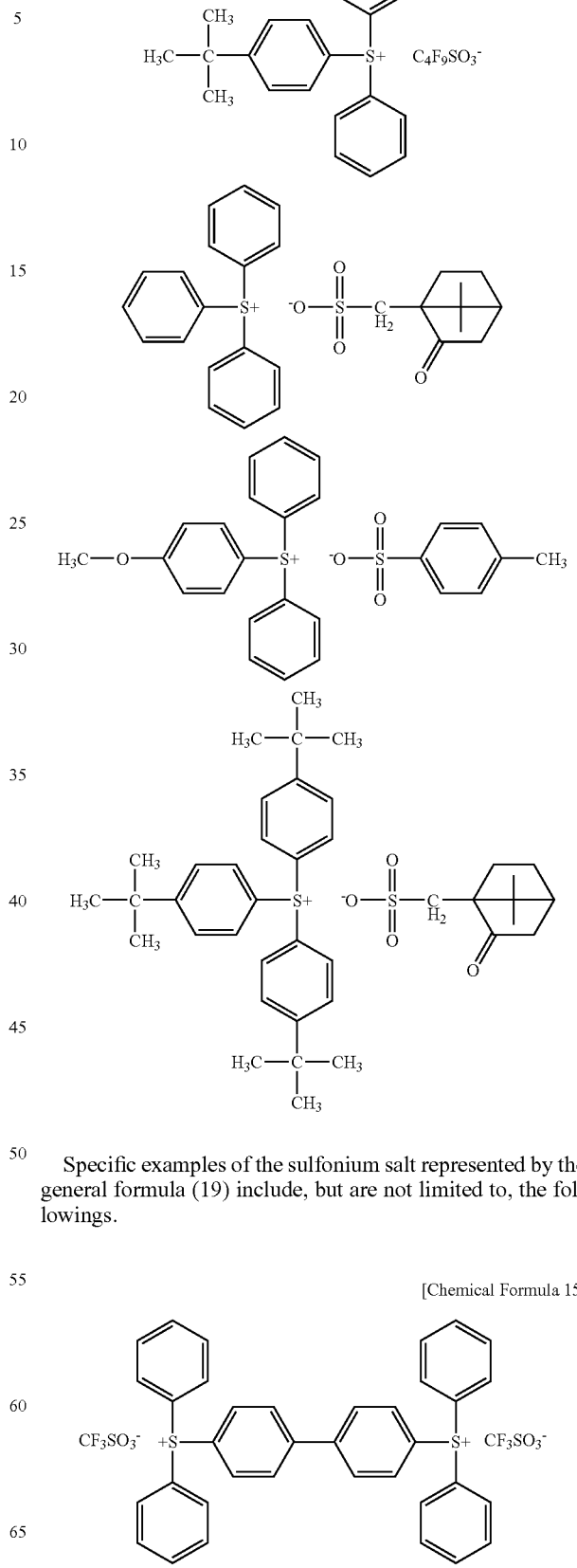
Specific examples of the sulfonium salt represented by the general formula (19) include, but are not limited to, the followings.
[Chemical Formula 15]

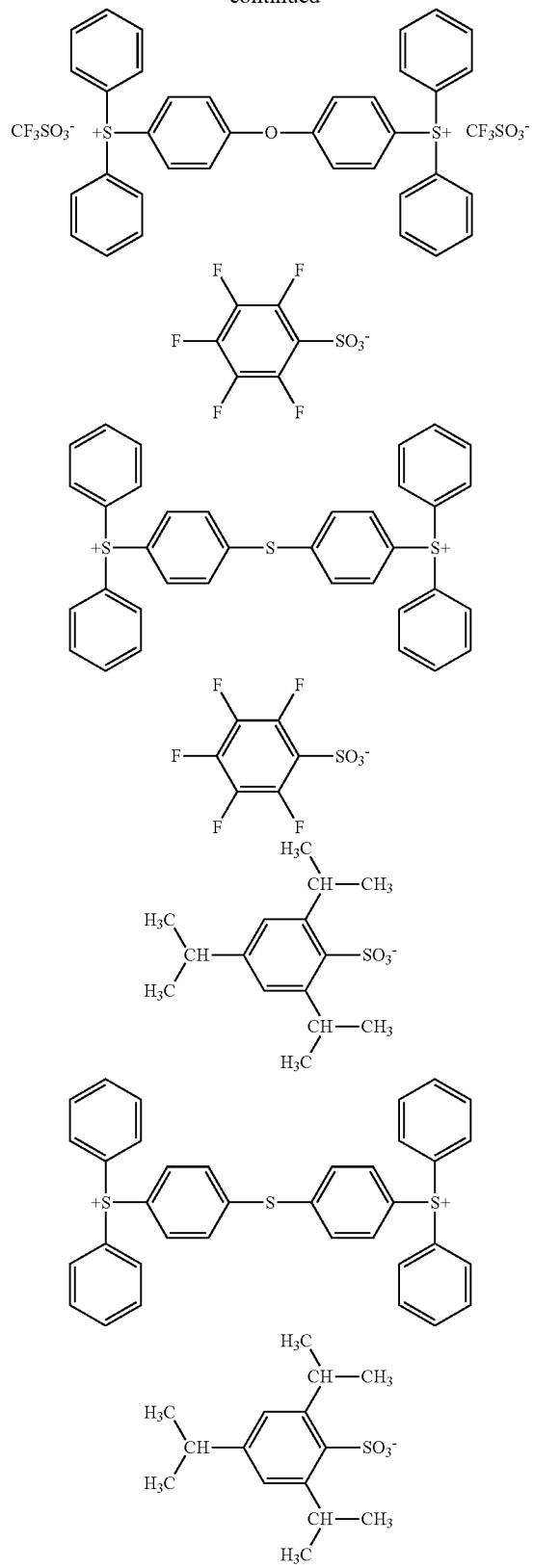

Specific examples of the sulfonium salt represented by general formula (20) include, but are not limited to, the followings.

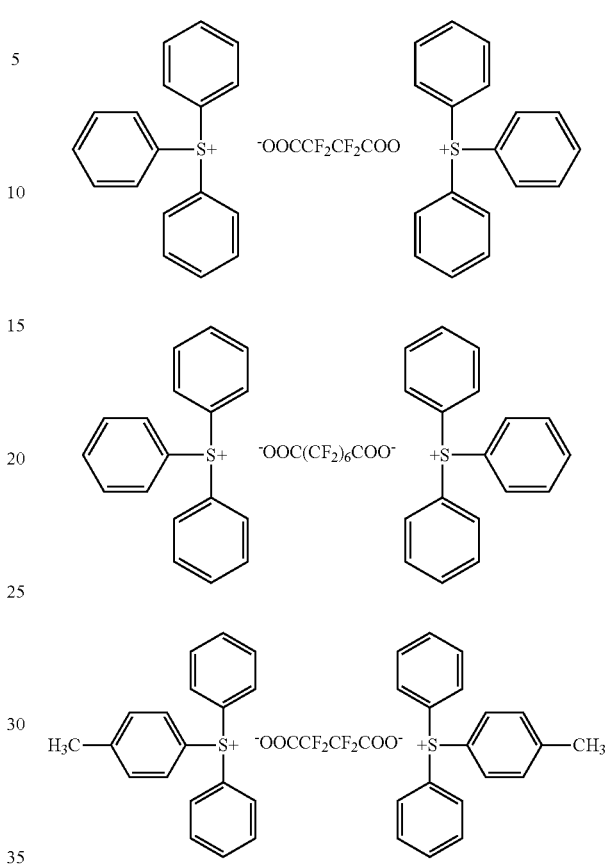

Particularly preferred one includes a triarylsulfonium salt represented by the general formula (21).

[Chemical Formula 17]

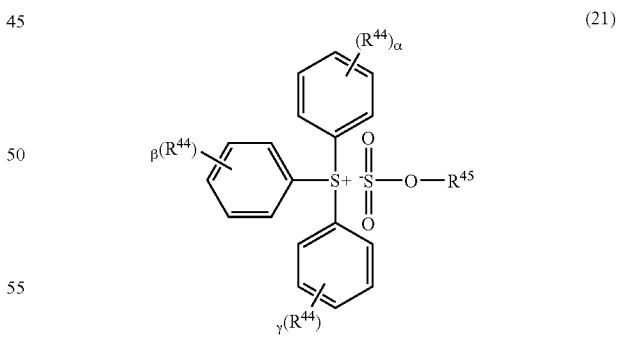

In the formula, $R^{44}$(s) each may be the same or different and represents either hydrogen or an organic group having 1 to 20 carbon atoms. $R^{45}$ represents an organic group having 1 to 20 carbon atoms. $\alpha$, $\beta$ and $\gamma$ each represents an integer of 0 to 5.

Specific examples of the triarylsulfonium salt represented by the general formula (21) include, but are not limited to, the followings.

[Chemical Formula 18]
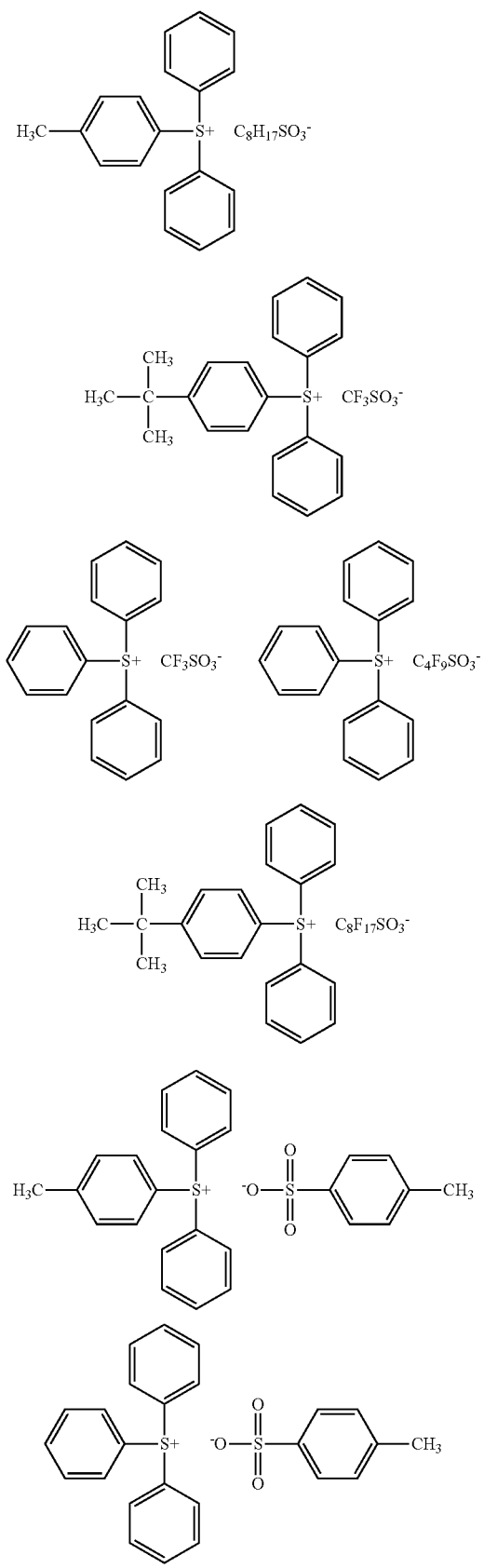

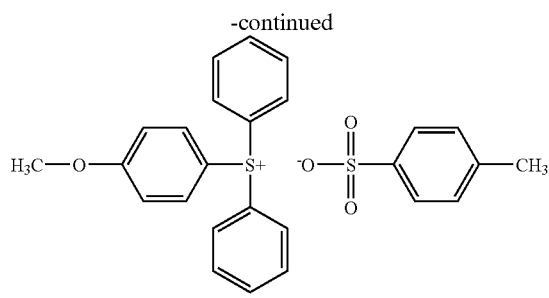

The amount of the photo acid generator to be added is preferably 0.01 or more and 50 or less parts by weight based on 100 parts by weight of the alkali-soluble resin. The amount of the quinonediazide compound is preferably 3 or more and 40 or less parts by weight. Each or total amount of the compound selected from a sulfonium salt, a phosphonium salt and a diazonium salt is preferably 0.05 or more and 40 or less parts by weight, and more preferably 3 or more and 30 or less parts by weight. High sensitivity can be attained by adding these compounds in the amount within the above range. If necessary, a sensitizer can also be added.

Examples of the photoamine generator in the component (C) include N-((2-nitrophenyl)-1-methylmethoxy)carbonyl-2-propylamine, N-((2-nitrophenyl)-1-methylmethoxy)carbonylcyclohexylamine, diphenyldisulfone, benzylsulfonamide, a cobalt-amine salt, benzyl carbamate, nitrobenzylcyclohexyl carbamate, di(methoxybenzyl)hexamethylene dicarbamate, [p-nitrobenzyloxycarbonyl]cyclohexylamine, [2,4-dinitrobenzyloxycarbonyl]cyclohexylamine, [3,4-dinitrobenzyloxycarbonyl]cyclohexylamine, [2,4,6-trinitrobenzyloxycarbonyl]cyclohexylamine, [(α-methyl)$_p$-nitrobenzyloxycarbonyl]cyclohexylamine, [(α-methyl)2,4-dinitrobenzyloxycarbonyl]cyclohexylamine, [(α-methyl)3,4-dinitrobenzyloxycarbonyl]cyclohexylamine, [(α-methyl)2,4,6-trinitrobenzyloxycarbonyl]cyclohexylamine, bis[p-nitrobenzyloxycarbonyl]hexamethylenediamine, bis[2,4-dinitrobenzyloxycarbonyl]hexamethylenediamine, bis[3,4-dinitrobenzyloxycarbonyl]hexamethylenediamine, bis[2,4,6-trinitrobenzyloxycarbonyl]hexamethylenediamine, bis[(α-methyl)$_p$-nitrobenzyloxycarbonyl]hexamethylenediamine, bis[(α-methyl) 2,4-dinitrobenzyloxycarbonyl]hexamethylenediamine, bis[(α-methyl)3,4-dinitrobenzyloxycarbonyl]hexamethylenediamine, bis[(α-methyl)2,4,6-trinitrobenzyloxycarbonyl]hexamethylenediamine, bis[p-nitrobenzyloxycarbonyl]methylphenylenediamine, bis[2,4-dinitrobenzyloxycarbonyl]methylphenylenediamine, bis[3,4-dinitrobenzyloxycarbonyl]methylphenylenediamine, bis[2,4,6-trinitrobenzyloxycarbonyl]methylphenylenediamine, bis[(α-methyl)$_p$-nitrobenzyloxycarbonyl]methylphenylenediamine, bis[(α-methyl)2,4-dinitrobenzyloxycarbonyl]methylphenylenediamine, bis[(α-methyl)3,4-dinitrobenzyloxycarbonyl]methylphenylenediamine, bis[(α-methyl)2,4,6-trinitrobenzyloxycarbonyl]methylphenylenediamine, bis[p-nitrobenzyloxycarbonyl]methanediphenylenediamine, bis[2,4-dinitrobenzyloxycarbonyl]methanediphenylenediamine, bis[3,4-dinitrobenzyloxycarbonyl]methanediphenylenediamine, bis[2,4,6-trinitrobenzyloxycarbonyl]methanediphenylenediamine, bis[(α-methyl)p-nitrobenzyloxycarbonyl]methanediphenylenediamine, bis[(α-methyl)2,4-dinitrobenzyloxycarbonyl]methanediphenylenediamine, bis[(α-methyl)3,4-dinitrobenzyloxycarbonyl]methanediphenylenediamine, and bis[(α-methyl)2,4,6-trinitrobenzyloxycarbonyl]methanediphenylenediamine.

These compounds may be used alone, or plural kinds of them may be used in combination. These compounds are preferably added in the amount of 1 to 40 parts by weight based on 100 parts by weight of the alkali-soluble resin. If necessary, a sensitizer can also be added.

If necessary, for the purpose of improving sensitivity of the photosensitive resin composition, a compound having a phenolic hydroxyl group can be added as long as a shrinkage rate after curing does not decrease.

Examples of the compound having a phenolic hydroxyl group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetrisFR-CR, BisRS-26X, and BisRS-OCHP (trade names, all of which are manufactured by Honshu Chemical Industry Co., Ltd.); and BIR-OC, BIP-PC, BIR-PC, BIR-PTBP, BIR-PCHP, BIP-BIOC-F, 4PC, BIR-BIPC-F, and TEP-BIP-A (trade names, all of which are manufactured by Asahi Organic Chemicals Industry Co., Ltd.).

Of these compounds, preferable compounds having a phenolic hydroxyl group used in the present invention are Bis-Z, Bis P-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, BIP-PC, BIR-PC, BIR-PTBP, and BIR-BIPC-F. Of these compounds, particularly preferable compounds having a phenolic hydroxyl group are Bis-Z, TekP-4HBPA, TrisP-HAP, TrisP-PA, BisRS-2P, BisRS-3P, BIR-PC, BIR-PTBP, and BIR-BIPC-F.

The resin composition obtained by adding the compound having a phenolic hydroxyl group is scarcely dissolved in an alkali developing solution before exposure, but is easily dissolved in the alkali developing solution after the exposure. Therefore, the development causes less thickness loss and the development can be easily conducted with a short time.

The amount of the compound having a phenolic hydroxyl group to be added is preferably 1 or more and 50 or less parts by weight, and more preferably 3 or more and 40 or less parts by weight, based on 100 parts by weight of the alkali-soluble resin.

If necessary, for the purpose of improving wettability of the photosensitive resin composition with a substrate, surfactants, esters such as ethyl lactate and propylene glycol monomethyl ether acetate, alcohols such as ethanol, ketones such as cyclohexanone and methyl isobutyl ketone, and ethers such as tetrahydrofuran and dioxane can be mixed. Also, inorganic particles of silicon dioxide and titanium dioxide, or a powder of polyimide can also be added.

Furthermore, for the purpose of enhancing the adhesion property of a base substrate such as a silicone wafer to the resin composition, the base substrate can also be pretreated with the adhesion promoter used in the present invention. In this case, using a solution prepared by dissolving 0.5 to 20% by weight of the adhesion promoter in a solvent such as isopropanol, ethanol, methanol, water, tetrahydrofuran, propylene glycol monomethyl ether acetate, propylene glycol monomethyl ether, ethyl lactate, or diethyl adipate, a surface treatment of the base substrate is conducted by spin coating, dipping, spray coating or a steam treatment. In some case, the reaction of the substrate and the adhesion promoter is accelerated by heating to a temperature within a range from 50 to 300° C.

The resin composition of the present invention preferably contains a thermocrosslinking compound having a phenolic hydroxyl group, or a urea bond represented by the general formula (22) and a methylol group or an alkoxymethyl group.

[Chemical Formula 19]

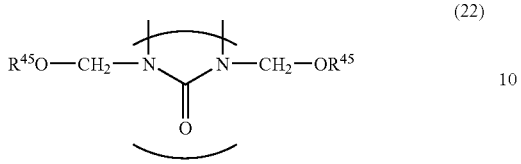

($R^{45}$ represents a monovalent organic group having 1 to 20 carbon atoms)

$R^{45}$ represents a monovalent organic group having 1 to 20 carbon atoms, preferably an organic group having 1 to 10 carbon atoms, and more preferably an organic group having 1 to 3 carbon atoms.

Examples of the thermocrosslinking compound having a phenolic hydroxyl group include, but are not limited to, the following compounds.

[Chemical Formula 20]

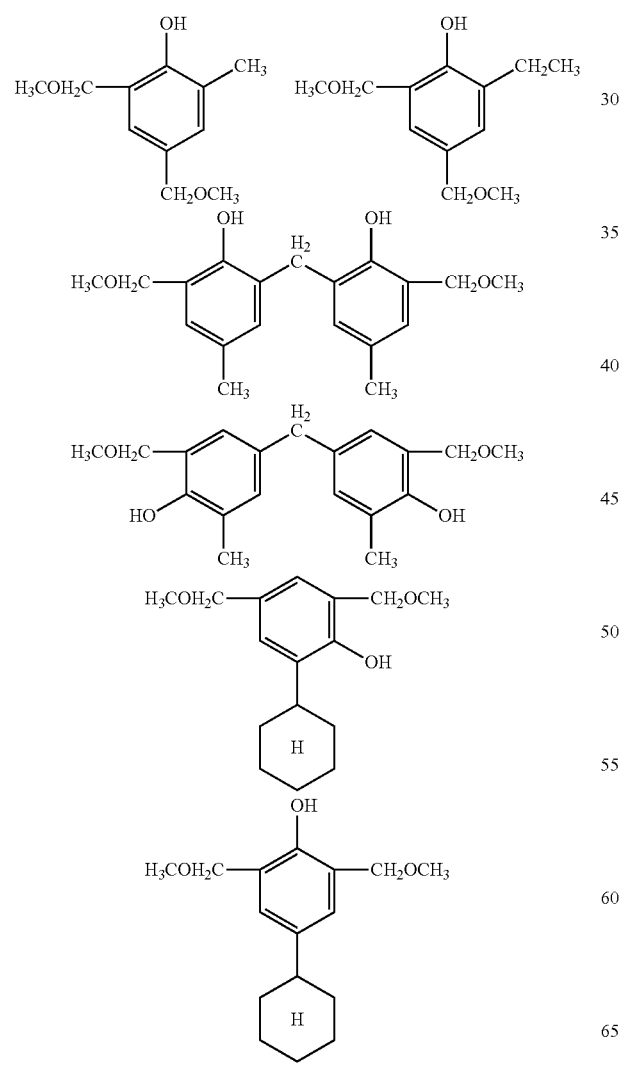

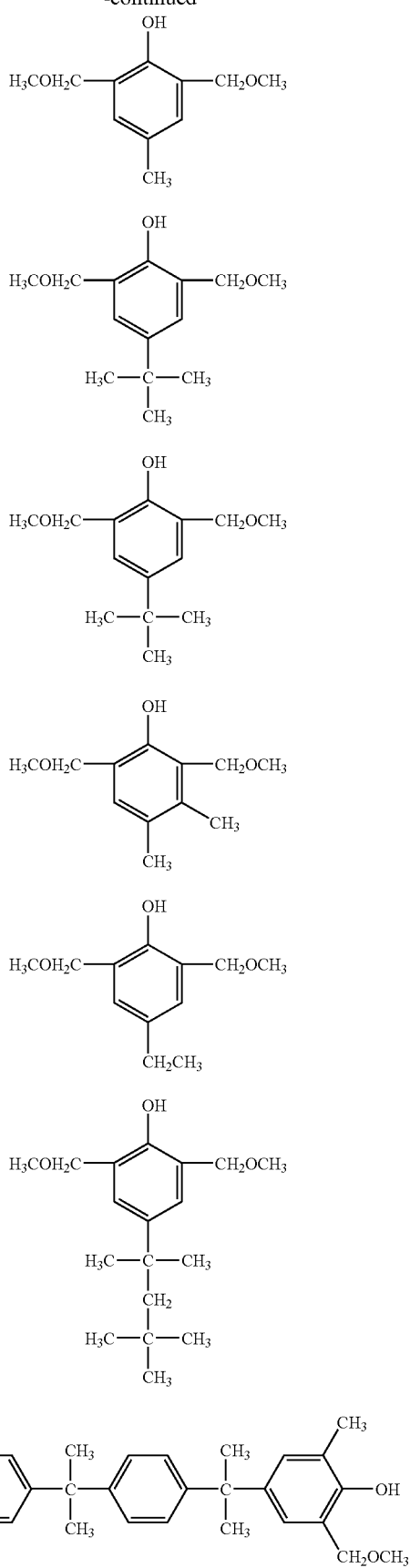

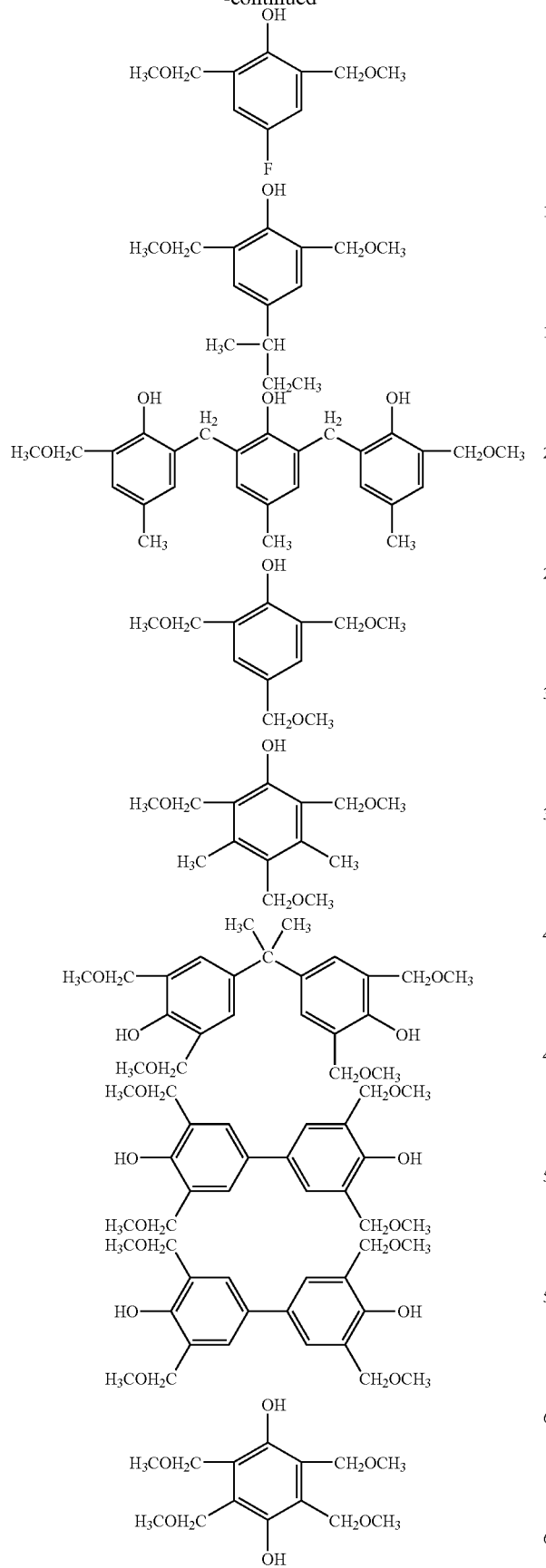
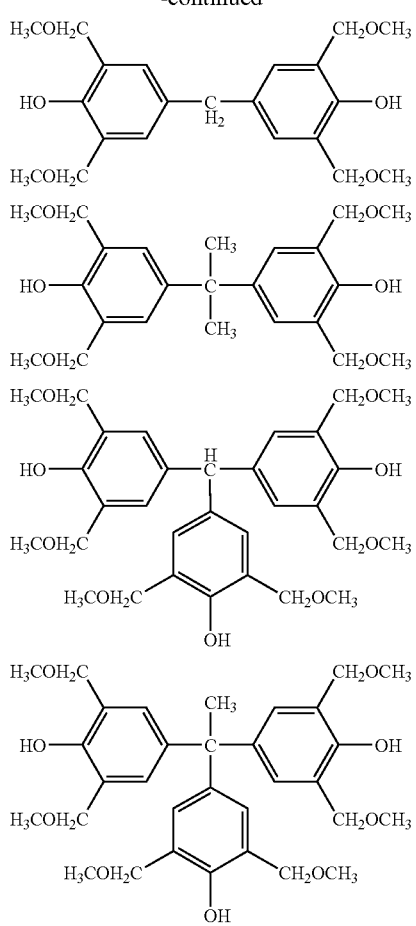
Specific examples of the compound having a group represented by the general formula (22) include, but are not limited to, the followings.
[Chemical Formula 21]
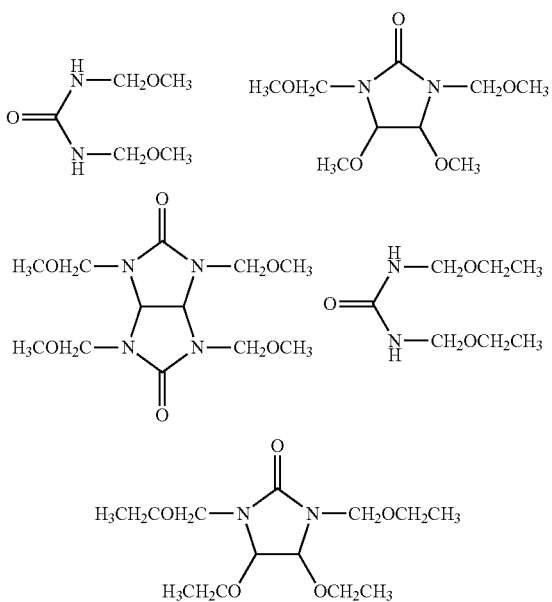

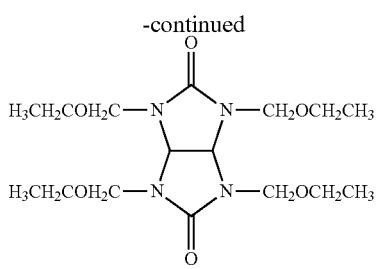

The photosensitive resin composition obtained by adding these thermocrosslinking compounds is scarcely dissolved in an alkali developing solution before exposure, but is easily dissolved in the alkali developing solution after the exposure. Therefore, the development causes less thickness loss and the development can be conducted with a short time, and also a shrinkage ratio after curing decreases.

Since the compound having a group represented by the general formula (22) shows remarkably slight absorption to light having an exposure wavelength as compared with a thermocrosslinking compound having a phenolic hydroxyl group, exposure energy is efficiently transmitted to a photosensitizer, resulting in high sensitivity and excellent heat resistance.

It has been found by recent studies that stability of a composition solution is further enhanced by an interaction between these thermocrosslinking compounds and a silicon compound having a secondary aromatic amino group and an alkoxy group.

The amount of the thermocrosslinking compound to be added is preferably 0.5 or more and 50 or less parts by weight, and more preferably 3 or more and 40 or less parts by weight, based on 100 parts by weight of the alkali-soluble resin.

The resin composition of the present invention preferably contains a solvent. It is possible to use, as the solvent, polar aprotic solvents such as N-methyl-2-pyrrolidone, γ-butyrolactone, N,N-dimethylformamide, N,N-dimethylacetamide, and dimethyl sulfoxide; ethers such as tetrahydrofuran, dioxane, and propylene glycol monomethyl ether; ketones such as acetone, methyl ethyl ketone, diisobutyl ketone, and diacetone alcohol; esters such as ethyl acetate, propylene glycol monomethyl ether acetate, and ethyl lactate; and aromatic hydrocarbons such as toluene and xylene alone or in combination.

The amount of the solvent to be used is preferably from 50 to 2,000 parts by weight, and particularly preferably from 100 to 1,500 parts by weight, based on 100 parts by weight of the alkali-soluble resin.

The method of forming a heat-resistant resin pattern using a photosensitive resin composition of the present invention will now be described.

The photosensitive resin composition is coated on a substrate. Examples of the substrate to be used include, but are not limited to, those made of a silicone wafer, ceramics, gallium arsenide, metal, glass, a metal oxide dielectric film, silicon nitride and ITO. Examples of the coating method include a spin coating method using a spinner, a spray coating method, a roll coating method and a slit die coating method. The thickness of a coating film varies depending on a coating method, a solid content of a composition, and viscosity, and the photosensitive resin composition is coated so that the thickness after drying is within a range from 0.1 to 150 μm.

Then, the substrate coated with the photosensitive resin composition is dried to obtain a photosensitive resin composition coating film. Drying is preferably conducted at a temperature within a range from 50 to 150° C. for one minute to several hours using an oven, a hot plate or infrared ray.

Then, the photosensitive resin composition coating film is exposed by irradiating with actinic radiation through a mask having a predetermined pattern. Actinic radiation used in the exposure includes, for example, ultraviolet ray, visible ray, electron beam or X-ray. In the present invention, i-line (365 nm), h-line (405 nm) or g-line (436 nm) of a mercury lamp is preferably used.

A pattern of the photosensitive resin composition coating film is formed by removing the exposed area using a developing solution after the exposure. The developing solution is preferably an aqueous solution of tetramethylammonium, or an aqueous solution of a compound having alkalinity such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In some case, it is possible to add polar solvents such as N-methyl-2-pyrrolidone, N,N-dimethylformamide, N,N-dimethyl acetamide, dimethyl sulfoxide, γ-butyrolactone, and dimethylacrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone alone, or several kinds of them to these aqueous alkali solutions. After the development, a rinsing treatment is conducted using water. The rinsing treatment may be conducted using water containing alcohols such as ethanol and isopropyl alcohol, and esters such as ethyl lactate and propylene glycol monomethyl ether acetate added therein.

After the development, the photosensitive resin composition coating film is converted into a heat-resistant resin coat by heating to a temperature within a range from 200 to 500° C. This heat treatment is conducted by stepwisely heating to a temperature selected, or conducted for 5 minutes to 5 hours while continuously heating to a temperature within a certain range. The method for a heat treatment includes, for example, a method of subjecting to a heat treatment at 130° C., 200° C. and 350° C. for each 30 minutes, or linearly heating from room temperature to 400° C. over 2 hours.

EXAMPLES

The present invention will now be described by way of examples, but the present invention is not limited to these examples.

1) Evaluation of Storage Stability of Composition and Adhesion Property of Pattern upon Development With respect to Examples 1 to 3, 6 to 8, a photosensitive resin composition (hereinafter referred to as a varnish) was spin-coated on a 6 inch silicone wafer and then baked on a hot plate (using a coating and developing apparatus Mark-7, manufactured by Tokyo Electron Limited) at 120° C. for 3 minutes to finally form a 10 μm thick prebaked film. This film was exposed at a light exposure of 0 to 800 mJ/cm² and a step of 25 mJ/cm² using an i-line stepper (DSW-8000, manufactured by GCA). After exposure, the film was developed with an aqueous 2.38% tetramethylammonium (TMAH) solution (ELM-D, manufactured by Mitsubishi Gas Chemical Company, Inc.) for 90 seconds and then rinsed with pure water.

With respect to Examples 4 and 5, a varnish was spin-coated on a 6 inch silicone wafer and then baked on a hot plate (using SKW-636, manufactured by Dainippon Screen Mfg. Co., Ltd.) at 100° C. for 1 minute and 30 seconds to finally form a 2 µm thick prebaked film. This film was exposed at a light exposure of 0 to 500 mJ/cm² and a step of 10 mJ/cm² using an i-line stepper (DSW-8000, manufactured by GCA). With respect to Example 5, the film was developed with an aqueous 2.38% TMAH solution (ELM-D, manufactured by Mitsubishi Gas Chemical Company, Inc.) for 90 seconds and then rinsed with pure water. With respect to Example 4, the film was developed with an aqueous 0.4% TMAH solution for 90 seconds and then rinsed with pure water.

The resulting pattern was observed using a microscope and a minimum light exposure Eth (1) required for formation of an image was estimated. This heat-resistant resin precursor varnish was allowed to stand at 23° C. for 3 days. The same evaluation was conducted and a minimum light exposure Eth (2) was estimated. A value of Eth (2)–Eth (1) was calculated and sensitivity variation of the varnish was evaluated. When an absolute value of this value is 50 mJ/cm² or less, storage stability was rated "Good", whereas, when an absolute value of this value is more than 50 mJ/cm², storage stability was rated "Poor".

Furthermore, a pattern in which line&space of the wafer became 1:1 after the development was observed, and the size (several µm) of the remained pattern was examined. It is preferred that a fine pattern is remained. When only a pattern having a size of 30 µm or more is remained, the adhesion property upon development was rated "Poor".

2) Evaluation of Adhesion Property with Substrate after Curing

First, a varnish was spin-coated on a silicone wafer and then baked on a hot plate (using Mark-7) at 120° C. for 3 minutes to finally form a 8 µm thick prebaked film. This film was placed in an oven and cured at 170° C. for 30 minutes, then cured at 300° C. for one hour to obtain a cured film. The curing was conducted in nitrogen. After forming 10 vertical cut lines and 10 horizontal cut lines on the cured film at an interval of about 2 mm respectively so as to form squares, a pressure cooker test (hereinafter referred to as PCT, apparatus used: EHS-221MD manufactured by TABAI MFG. Co., Ltd.) treatment was conducted for 200 hours. Then, a tape Cellotape® (manufactured by Nichiban Co., Ltd.) was adhered thereonto and the tape was strongly separated to evaluate the film with the number of separated squares among 100 squares as follows. When the number of separated squares is less than 10, the adhesion property was rated "Good", whereas, when the number of separated squares is 10 or more, the adhesion property was rated "Poor". The PCT treatment was conducted at saturated conditions at 121° C. under 0.21 MPa.

3) Calculation of Shrinkage Rate

In the above (2), a shrinkage rate was calculated from a comparison between the thickness of a prebaked film and that of a cured film after curing in accordance with the following equation.

Shrinkage Rate(%)=(Thickness of Film after Prebaking Thickness of Film after Curing)/Thickness of Film after Prebakin×100

Synthesis Example 1

Synthesis of Hydroxyl Group-Containing Acid Anhydride (a)

Under a dry nitrogen gas stream, 18.3 g (0.05 mol) of 2,2-bis(3-amino-4-hydroxyphenyl)hexafluoropropane (BAHF, manufactured by Central Glass Co., Ltd.) and 34.2 g (0.3 mol, manufactured by Tokyo Chemical Industry Co., Ltd.) of allyl glycidyl ether were dissolved in 100 g of γ-butyrolactone (hereinafter referred to as GBL, manufactured by Mitsubishi Chemical Corp), followed by cooling to −15° C. To the solution, a solution prepared by dissolving 22.1 g (0.11 mol, manufactured by Tokyo Chemical Industry Co., Ltd.) of anhydrous trimellitic acid chloride in 50 g of GBL was added dropwise so that the temperature of the reaction solution does not exceed 0° C. After the completion of dropwise addition, the reaction was conducted at 0° C. for 4 hours. The solution was concentrated using a rotary evaporator and then introduced into 1 L of toluene to obtain an acid anhydride (a).

[Chemical Formula 22]

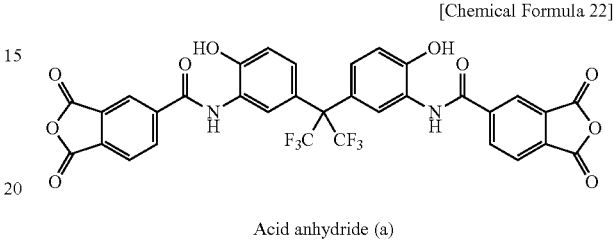

Acid anhydride (a)

Synthesis Example 2

Synthesis of Hydroxyl Group-Containing Diamine Compound (b)

18.3 g (0.05 mol) of BAHF was dissolved in 100 mL of acetone and 17.4 g (0.3 mol, manufactured by Tokyo Chemical Industry Co., Ltd.) of propylene oxide, followed by cooling to −15° C. To the solution, a solution prepared by dissolving 20.4 g (0.11 mol, manufactured by Tokyo Chemical Industry Co., Ltd.) of 3-nitrobenzoylchloride in 100 ml of acetone. After the completion of dropwise addition, the reaction was conducted at −15° C. for 4 hours and the temperature was returned to room temperature. The precipitated white solid was collected by filtration and then vacuum-dried at 50° C.

30 g of the resulting solid was placed in a 300 mL stainless steel autoclave and was dispersed in 250 mL of methyl cellosolve, and then 2 g of 5% palladium carbon (manufactured by Wako Pure Chemical Industries, Ltd.) was added. Hydrogen was introduced using a balloon and the reductive reaction was conducted at room temperature. After about 2 hours, it was confirmed that the balloon does not become deflated anymore, and the reaction was completed. After the completion of the reaction, a palladium compound as a catalyst was removed by filtration and the reaction solution was concentrated using a rotary evaporator to obtain a diamine compound (b). The resulting solid was used for the reaction as it is.

[Chemical Formula 23]

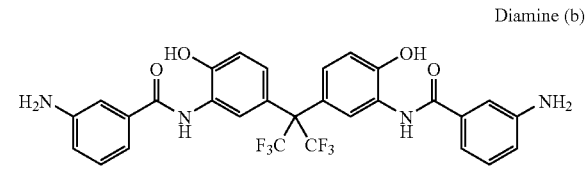

Diamine (b)

Synthesis Example 3

Synthesis of Hydroxyl Group-Containing Diamine (c)

15.4 g (0.1 mol) of 2-amino-4-nitrophenol was dissolved in 50 mL of acetone and 30 g (0.34 mol) of propylene oxide, followed by cooling to −15° C. To the solution, a solution prepared by dissolving 11.2 g (0.055 mol, manufactured by Tokyo Chemical Industry Co., Ltd.) of isophthalic acid chloride in 60 mL of acetone was gradually added dropwise. After the completion of dropwise addition, the reaction was conducted at −15° C. for 4 hours. After the temperature was returned to room temperature, the produced precipitate was collected by filtration.

The resulting precipitate was dissolved in 200 mL of GBL and 3 g of 5% palladium carbon was added, followed by vigorous stirring. After attaching a balloon filled with a hydrogen gas, stirring was continued at room temperature until the balloon filled with a hydrogen gas becomes a state where the balloon does not become deflated anymore, followed by stirring in a state where the balloon filled with a hydrogen gas is attached for additional 2 hours. After the completion of stirring, a palladium compound was removed by filtration and the solution was concentrated using a rotary evaporator until the amount is reduced in half. To the solution, ethanol was added recrystallization was conducted to obtain a crystal of the objective compound.

[Chemical Formula 24]

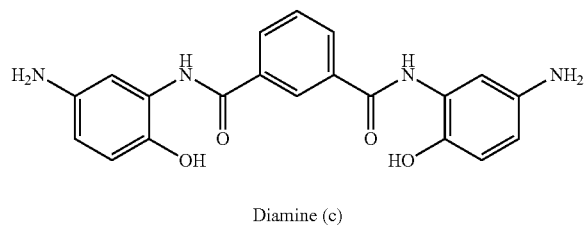

Diamine (c)

Synthesis Example 5

Synthesis of Quinonediazide Compound (e)

Under a dry nitrogen gas stream, 16.10 g (0.05 mol) of BisP-RS (trade name, manufactured by Honshu Chemical Industry Co., Ltd.) and 26.86 g (0.1 mol) of 5-naphthoquinonediazidesulfonyl acid chloride (NAC-5, manufactured by Toyo Gosei Co., Ltd.) were dissolved in 450 g of 1,4-dioxane, and then the solution temperature was adjusted to room temperature. To the solution, a mixture of 50 g of 1,4-dioxane and 10.12 g of triethylamine was added dropwise so that the temperature in the system does not increased to 35° C. or higher. After dropwise addition, the solution was stirred at 30° C. for 2 hours. A triethylamine salt was removed by filtration and the filtrate was poured into water. Then, the precipitate was collected by filtration and washed with 1 L of 1% hydrochloric acid. The precipitate was further washed twice with 2 L of water. The precipitate was dried using a vacuum dryer to obtain a quinonediazide compound (e).

[Chemical Formula 25]

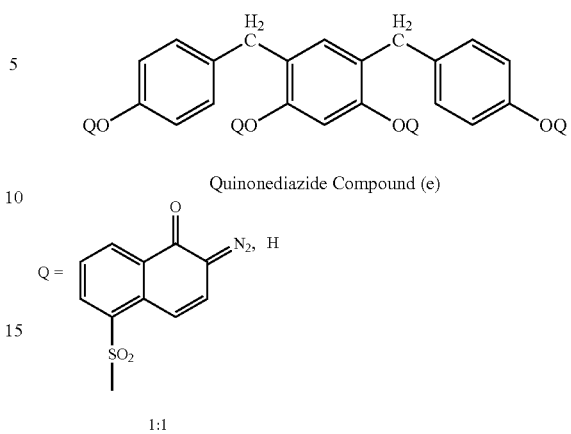

Quinonediazide Compound (e)

1:1

Synthesis Example 6

Synthesis of Quinonediazide Compound (f)

Under a dry nitrogen gas stream, 15.31 g (0.05 mol) of Tris P-HAP (trade name, manufactured by Honshu Chemical Industry Co., Ltd.) and 26.86 g (0.10 mol) of NAC-5 were dissolved in 450 g of 1,4-dioxane, and then the solution temperature was adjusted to room temperature. To the solution, a mixture of 50 g of 1,4-dioxane and 15.18 g of triethylamine was added dropwise in the same manner as in Synthesis Example 5 to obtain the following quinonediazide compound (f) in which two Q(s) on average are 5-naphthoquinonediazidesulfonate-esterified.

[Chemical Formula 26]

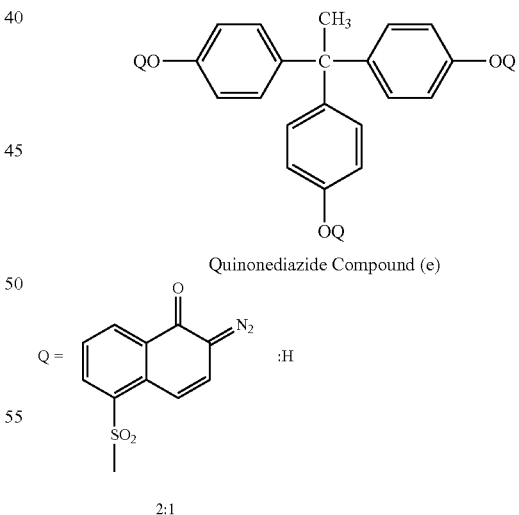

Quinonediazide Compound (e)

2:1

Synthesis Example 7

Synthesis of Quinonediazide Compound (g)

Under a dry nitrogen gas stream, 21.22 g (0.05 mol) of Tris P-PA (trade name, manufactured by Honshu Chemical Industry Co., Ltd.), 13.43 g (0.05 mol) of NAC-5 and 13.43 g mol, NAC-4, manufactured by Toyo Gosei Co., Ltd.) of 4-naphthoquinonediazidesulfonyl acid chloride were dissolved in 450 g of 1,4-dioxane, and then the solution temperature was adjusted to room temperature. To the solution, a mixture of 50 g of 1,4-dioxane and 12.65 g of triethylamine was added dropwise in the same manner as in Synthesis Example 5 to obtain a quinonediazide compound (g) in which one Q on average was converted into a 5-naphthoquinonediazidesulfonate ester and one Q on average was converted into a 4-naphthoquinonediazidesulfonate ester.

[Chemical Formula 27]

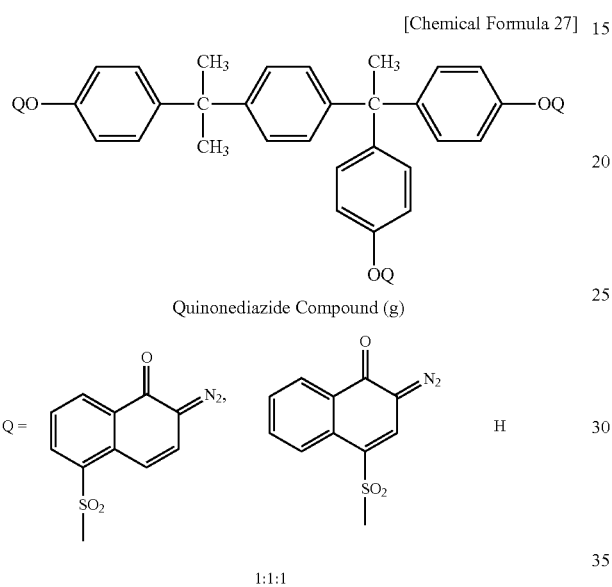

Quinonediazide Compound (g)

1:1:1

The thermocrosslinking compounds, photo acid generators and dissolution adjusting agents used in the respective Examples and Comparative Examples are shown below.

[Chemical Formula 28]

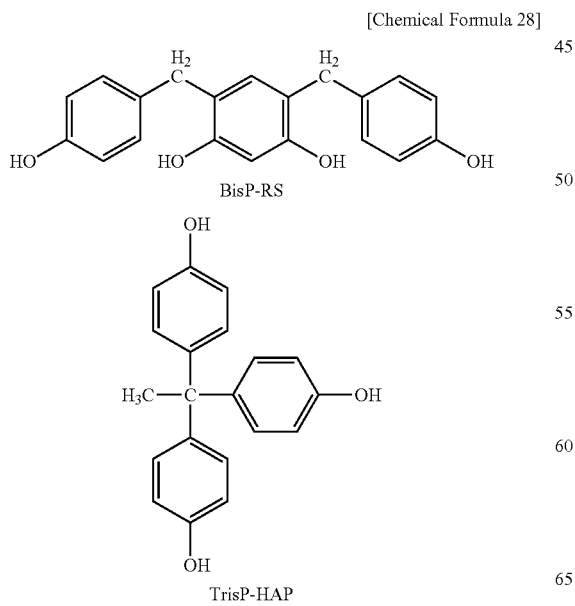

BisP-RS

TrisP-HAP

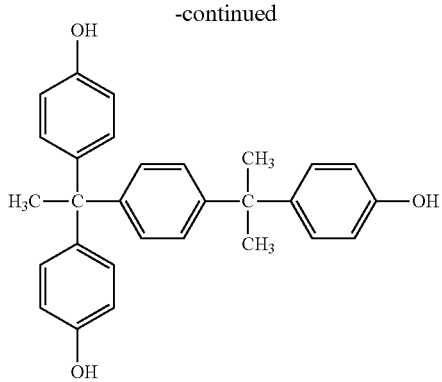

TrisP-PA

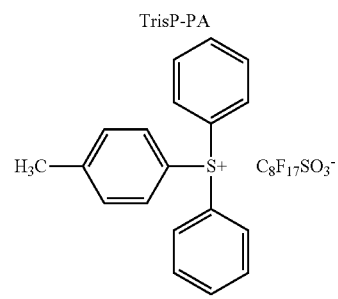

WPAG-314

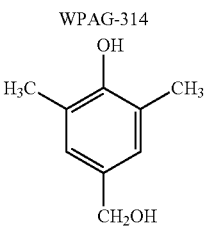

4M-26XL

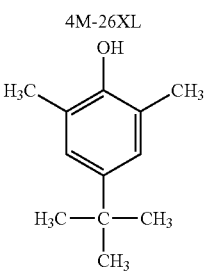

DML-PTBP

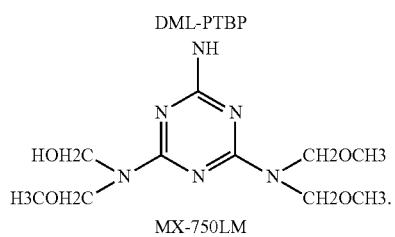

MX-750LM

Synthesis Example 9

Synthesis of Adhesion Promoter A1

In a 200 mL four-necked flask, 10.9 g (0.1 mol) of 3-aminophenol (manufactured by Tokyo Chemical Industry Co., Ltd.) was charged and 100 g of ethyl lactate (hereinafter referred to as EL, manufactured by Musashino Chemical Laboratory, Ltd.) was added. To the solution, 23.6 g (0.1 mol) of 3-glycidoxypropyltrimethoxysilane (KBM-403, manufactured by Shin-Etsu Chemical Co., Ltd.) was added, followed by stirring at 60° C. for 3 hours to obtain an adhesion promoter A1.

Synthesis Example 10

Synthesis of Adhesion Promoter B1

36.6 g (0.1 mol) of BAHF was dissolved in 100 g of EL. To the solution, 55.6 g (0.2 mol) of 3-glycidoxypropyltriethoxysilane (KBE-403, manufactured by Shin-Etsu Chemical Co., Ltd.) was added, followed by stirring at 50° C. for 6 hours to obtain an adhesion promoter B1.

Synthesis Example 11

Synthesis of Adhesion Promoter A2

16.1 g (0.1 mol) of 2-trifluoromethylaniline (manufactured by Tokyo Chemical Industry Co., Ltd.) was dissolved in 50 g of propylene glycol monomethyl ether. Then, 24.8 g (0.1 mol) of 3-glycidoxypropylmethyldiethoxysilane (KBE-402, manufactured by Shin-Etsu Chemical Co., Ltd.) was added, followed by stirring at 80° C. for 2 hours to obtain an adhesion promoter A2.

Synthesis Example 12

Synthesis of Adhesion Promoter B2

28 g (0.1 mol) of bis(3-amino-4-hydroxyphenyl)sulfone (manufactured by NIPPON KAYAKU CO., LTD.) was dissolved in 30 g of N-methyl-2-pyrrolidone (hereinafter referred to as NMP, manufactured by Mitsubishi Chemical Corp.) and 36.9 g (0.15 mol) of 2-(3,4-epoxycyclohexyl) ethyltrimethoxysilane (KBM-303, manufactured by Shin-Etsu Chemical Co., Ltd.) was added, followed by stirring at 70° C. for 4 hours to obtain an adhesion promoter B2.

Synthesis Example 13

Synthesis of Adhesion Promoter C1

9.5 g of M-1540 (manufactured by Daito Sangyo Co., Ltd., active H equivalent: 95 g/eq) as an aromatic polyamine was dissolved in 30 g of N-methyl-2-pyrrolidone and 78 g (0.33 mol) of KBM-403 was added, followed by stirring at 40° C. for 8 hours to obtain an adhesion promoter C1.

Synthesis Example 14

Synthesis of Adhesion Promoter B3

30 g (0.1 mol) of bis(3-amino-4-hydroxyphenyl)fluorine (manufactured by JFE Chemical Corporation) was dissolved in 30 g of NMP 30 g and 55.6 g (0.2 mol) of KBE-403 was added, followed by stirring at 70° C. for 4 hours to obtain an adhesion promoter B3.

Synthesis Example 15

Synthesis of Adhesion Promoter D1

3.58 g (0.02 mol) of 3-aminopropyltrimethoxysilane (KBM-903, manufactured by Shin-Etsu Silicones Co., Ltd.) was dissolved in 20 g of NMP. To the solution, 3.22 g (0.01 mol) of 3,3',4,4'-benzophenonetetracarboxylic dianhydride (manufactured by Daicel Chemical Industries, Ltd.) was added in the form of a solid. The solution was stirred at 30° C. for 6 hours to obtain a silane compound (D1) in which an amino group of an aminosilane compound is amide-bonded to an aromatic carboxylic acid.

Example 1

Under a dry nitrogen gas stream, 5.01 g (0.025 mol) of 4,4'-diaminophenylether (manufactured by Wakayama Seika Kogyo Co., Ltd.) and 1.24 g (0.005 mol) of 1,3-bis(3-aminopropyl)tetramethyldisiloxane (SiDA, manufactured by Dow Corning Toray Co., Ltd.) were dissolved in 50 g of NMP. To the solution, 21.4 g (0.03 mol) of the hydroxyl group-containing acid anhydride (a) obtained in Synthesis Example 1 was added together with 14 g of NMP, followed by stirring at 20° C. for one hour and further stirring at 50° C. for 4 hours. Then, a solution prepared by diluting 7.14 g (0.06 mol) of N,N-dimethylformamide dimethylacetal (DFA, manufactured by Mitsubishi Rayon Co., Ltd.) with 5 g of NMP was added dropwise over 10 minutes. After dropwise addition, the solution was stirred at 40° C. for 3 hours to obtain a polymer solution A containing an alkali-soluble polyimide precursor resin.

To 40 g the resulting polymer solution A, 2 g of the quinonediazide compound (e) obtained in Synthesis Example 5 as a photo acid generator, 1 g of the adhesion promoter A1 obtained in Synthesis Example 9 and 1 g of DML-MBPC (trade name, manufactured by Honshu Chemical Industry Co., Ltd.) as a thermocrosslinking agent were added to obtain a varnish A of a photosensitive polyimide precursor composition. Using the resulting varnish, pattern processing was evaluated as described above. Sensitivity variation was 0 mJ/cm$^2$. Also, a fine pattern having a size of 5 μm or more was remained. In the evaluation of the adhesion property to a substrate, the number of peeled samples was 0, Shrinkage rate was 18%.

Example 2

Under a dry nitrogen gas stream, 57.4 g (0.095 mol) of the hydroxyl group-containing diamine (b) obtained in Synthesis Example 2 and 1.24 g (0.005 mol) of SiDA were dissolved in 200 g of NMP. To the solution, 3,3',4,4'-diphenylethertetracarboxylic dianhydride (manufactured by Manac Incorporated, 0.1 mol, ODPA) was added, followed by stirring at 40° C. for 2 hours. Then, a solution prepared by diluting 7.14 g (0.06 mol) of DFA with 5 g of NMP was added dropwise over 10 minutes. After dropwise addition, stirring was continued at 40° C. for 2 hours.

After the completion of stirring, the solution was poured into 2 L of water and a precipitate of a polymer solid was collected by filtration. Furthermore, the precipitate was washed three times with 2 L of water and the collected polymer solid was dried in a vacuum dryer at 50° C. for 72 hours to obtain a polymer B containing an alkali-soluble polyimide precursor resin.

After weighing 10 g of a solid of the resulting polymer B, 2 g of the quinonediazide compound (f) obtained in Synthesis Example 6 as a photo acid generator, 0.5 g of WPAG-505 (trade name, manufactured by Wako Pure Chemical Industries, Ltd.), 2 g of DML-PTBP (trade name, manufactured by Honshu Chemical Industry Co., Ltd.) as a thermocrosslinking agent, 1 g of the adhesion promoter B1 obtained in Synthesis Example 10 and 1.5 g of Bis-Z (trade name, manufactured by Honshu Chemical Industry Co., Ltd.) as a polyhydroxy compound were dissolved in 30 g of GBL to obtain a varnish B of a photosensitive polyimide precursor composition. Using the resulting varnish, pattern processing was evaluated as described above. Sensitivity variation was 0 mJ/cm$^2$. Also, a fine pattern having a size of 5 µm or more was remained. In the evaluation of the adhesion property to a substrate, the number of peeled samples was 0, Shrinkage rate was 19%.

Example 3

Under a dry nitrogen gas stream, 18.3 g (0.05 mol) of BAHF was dissolved in 50 g of NMP and 26.4 g (0.3 mol) of glycidyl methyl ether and the solution was cooled −15° C. To the solution, a solution prepared by dissolving 14.7 g (manufactured by Nihon Nohyaku Co., Ltd., 0.050 mol) of diphenyletherdicarboxylic acid dichloride in 25 g of GBL was added dropwise so that the inner temperature does not exceed 0° C. After the completion of dropwise addition, stirring was continued at −15° C. for 6 hours. After the completion of the reaction, the solution was poured into 3 L of water containing 10% by weight of methanol and a white precipitate was collected. The precipitate was collected by filtration, washed three times with water and then dried in a vacuum dryer at 50° C. for 72 hours to obtain a polymer G containing an alkali-soluble polybenzooxazole precursor resin.

In 30 g of GBL, 10 g of a solid of the resulting polymer G, 2 g of the quinonediazide compound (f) obtained in Synthesis Example 6 as a photo acid generator, 0.7 g of WPAG-314 (trade name, manufactured by Wako Pure Chemical Industries, Ltd.) and 1 g of an adhesion promoter A2 obtained in Synthesis Example 14 were dissolved to obtain a varnish C of a photosensitive polybenzooxazole precursor composition. Using the resulting varnish, pattern processing was evaluated as described above. Sensitivity variation was 25 mJ/cm$^2$. Also, a fine pattern having a size of 5 µm or more was remained. In the evaluation of the adhesion property to a substrate, the number of peeled samples was 0, Shrinkage rate was 23%.

Comparative Example 1

In the same manner as in Example 1, except that the adhesion promoter A1 was replaced by 3-aminopropyltrimethoxysilane (KBM-903, manufactured by Shin-Etsu Silicones Co., Ltd.) in Example 1, a varnish L of a photosensitive polyimide precursor composition was obtained. Using the resulting varnish, pattern processing was evaluated as described above. Sensitivity variation was large such as 200 mJ/cm$^2$. Also, a fine pattern having a size of 15 µm or less was peeled.

Comparative Example 2

In the same manner as in Example 2, except that the adhesion promoter B1 was replaced by KBM-403 in Example 2, a varnish M of a photosensitive polyimide precursor composition was obtained. Using the resulting varnish, pattern processing was evaluated as described above. Sensitivity variation was 0 mJ/cm$^2$ and a fine pattern having a size of 30 µm or less was peeled.

Example 4

In a 500 mL four-necked flask equipped with a thermometer, a stirrer, a nitrogen introducing tube and a dropping funnel, 300 mL of propylene glycol monomethyl ether was charged and the temperature of the solution was adjusted to 85° C. To the solution, a solution prepared by diluting 30 g (0.29 mol) of styrene (manufactured by Tokyo Chemical Industry Co., Ltd.), 30 g (0.35 mol) of methacrylic acid (manufactured by Tokyo Chemical Industry Co., Ltd.) and 40 g (0.4 mol) of methyl methacrylate (manufactured by Tokyo Chemical Industry Co., Ltd.) with 100 g of propylene glycol monomethyl ether was added dropwise over 2 hours. After the completion of dropwise addition, the temperature of the solution was raised to 95° C. and 0.5 g of azoisobutyronitrile (manufactured by Tokyo Chemical Industry Co., Ltd.) by 5 portions every 30 minutes. The solution temperature was adjusted to 95° C., followed by stirring for one hour and a half and further cooling to room temperature to obtain a polymer solution containing an alkali-soluble acrylic polymer.

100 g of the solution was mixed with 2 g of a naphthoquinonediazide compound (1) as a photo acid generator, 2 g of NIKALACMX-750LM (trade name, Sanwa Chemical Co., Ltd.) as a thermocrosslinking agent and 1 g of the adhesion promoter C1 obtained in Synthesis Example 13 as an adhesion promoter, followed by filtration with a membrane filter having a pore size of 0.22 µm to obtain a varnish D.

Using the resulting varnish, pattern processing was evaluated as described above. Sensitivity variation was 10 mJ/cm$^2$. Also, a fine pattern having a size of 5 µm or more was remained. In the evaluation of the adhesion property to a substrate, the number of peeled samples was 0, Shrinkage rate was 15%.

Example 5

68 g (0.5 mol) of methyltrimethoxysilane (manufactured by Shin-Etsu Chemical Co., Ltd., KBM-13) and 19.8 g (0.1 mol) of phenyltrimethoxysilane (KBM-103, manufactured by Shin-Etsu Chemical Co., Ltd.) were dissolved in 171.6 g of propylene glycol monomethyl ether. To the solution, 0.88 g of hydrochloric acid and 32.4 g of water were added while stirring. Stirring was continued at 30° C. for 5 minutes and the temperature of a bath was adjusted to 105° C., followed by stirring for 3 hours. As a result, 49 g of by-products composed mainly of methanol were distillated. The bath temperature was adjusted to 125° C. and the inner temperature was adjusted to 113° C., and then 27 g of components composed mainly of acetic acid, water and propylene glycol monomethyl ether were distilled. After cooling to room temperature, an alkali-soluble siloxane polymer was obtained.

To 20 g of the solution, 0.1 g of benzoine tosylate as a photo acid generator, 0.2 g of 2,6-diacetoxymethyl-paracresol as a crosslinking agent and 0.5 g of the adhesion promoter B3 obtained in Synthesis Example 14 as an adhesion promoter were added to obtain a varnish E.

Using the resulting varnish, pattern processing was evaluated as described above. Sensitivity variation was 0 mJ/cm$^2$. Also, a fine pattern having a size of 5 µm or more was remained. In the evaluation of the adhesion property to a substrate, the number of peeled samples was 0, Shrinkage rate was 22%.

Example 6

18.3 g (0.05 mol) of BAHF was dissolved in 150 mL of ethanol (manufactured by Nacalai Tesque, Inc.), followed by cooling to 5° C. To the solution, 11.2 g (0.1 mol) of potassium t-butoxide (manufactured by Tokyo Chemical Industry Co., Ltd.) was gradually added. Furthermore, 21.8 g (0.1 mol) of dicarbonic acid-t-butyl (manufactured by Tokyo Chemical Industry Co., Ltd.) was gradually added, followed by continuous stirring for 2 hours to obtain a diamine compound in which a hydroxyl group of BAHF is protected with a t-butoxycarbonyl group. The solution was poured into 1 L of water to obtain a precipitate. The precipitate was collected by filtration and then dried in a vacuum dryer at 30° C. for 20 hours.

Under a dry nitrogen gas stream, 27.5 g (0.075 mol) of BAHF and 13.4 g (0.025 mol) of the diamine compound in which a hydroxyl group of BAHF is protected with a t-butoxycarbonyl group synthesized above were dissolved in 150 mL of N,N-dimethylacetamide, followed by cooling to −5° C. To the solution, 52.8 g (0.6 mol) of glycidyl methyl ether was added and a solution prepared by dissolving 20.3 g (0.1 mol) of an isophthalic acid dichloride (manufactured by Tokyo Chemical Industry Co., Ltd.) in 100 g of acetone was added dropwise so that the temperature of the reaction solution does not exceed 0° C. After the completion of dropwise addition, the temperature of the solution was raised to 10° C., followed by continuous stirring for one hour and further stirring at 20° C. for 6 hours. After the completion of stirring, the solution was poured into 10 L of water to obtain a precipitate of polyhydroxyamide. The precipitate was collected by filtration and then dried in a vacuum dryer at 60° C. for 20 hours to obtain an alkali-soluble polyhydroxyamide (a polybenzooxazole precursor). 10 g of a solid of the resulting dried polyhydroxyamide, 0.5 g of NAI-105 (manufactured by Midori Kagaku Co., Ltd.) as a photo acid generator, 2 g of a quinonediazide compound (g) and 1 g of the adhesion promoter B2 obtained in Synthesis Example 12 as an adhesion promoter were dissolved in 20 g of GBL to obtain a varnish F of a photosensitive polybenzooxazole precursor.

Using the resulting varnish, pattern processing was evaluated as described above. Sensitivity variation was 25 mJ/cm². Also, a fine pattern having a size of 5 μm or more was remained. In the evaluation of the adhesion property to a substrate, the number of peeled samples was 10. Shrinkage rate was 23%.

Example 7

Under a dry nitrogen gas stream, in a 500 mL four-necked flask, 31 g (0.1 mol) of 3,3',4,4'-diphenylethertetracarboxylic dianhydride, 26 g (0.2 mol) of hydroxyethyl methacrylate (manufactured by Tokyo Chemical Industry Co., Ltd.), 10 g of pyridine and 100 mL of GBL were charged and then reacted at 30° C. for 12 hours. Then, the solution was cooled to −5° C.

Under a dry nitrogen gas stream, 41.2 g (0.2 mol) of dicyclohexylcarbodiimide (manufactured by Tokyo Chemical Industry Co., Ltd.) was dissolved in 50 mL of GBL with heating. The solution of dicyclocarbodiimide was added dropwise in the above-described cooled solution over 20 minutes. Although a white precipitate was produced, stirring was continued.

To the solution, 10.15 g (0.05 mol) of 4,4'-diaminodiphenylether and 7.6 g (0.05 mol) of 3,5-diaminobenzoic acid (manufactured by Tokyo Chemical Industry Co., Ltd.) were added in the form of a solid. While maintaining the temperature within a range from 0 to 5° C., stirring was continued for 4 hours. The temperature of the solution was gradually returned to room temperature, followed by stirring for one hour. The resulting solution was filtered to remove a white solid and the filtrate was poured into 5 L of water, and then the precipitate was recovered, washed and dried under reduced pressure to obtain a polymer containing an alkali-soluble polyimide resin.

30 g of the solid polymer dried under reduced pressure, 0.9 g of Irgacure 369 (manufactured by Chiba Specialty Chemicals Co., Ltd.) as a photopolymerization initiator, 3 g of ethylene glycol dimethacrylate (Shin-Nakamura Chemical Co., Ltd.) as a thermocrosslinking agent, 2 g of DMOM-PTBP (trade name, manufactured by Honshu Chemical Industry Co., Ltd.) and 3 g of the adhesion promoter B1 obtained in Synthesis Example 10 as an adhesion promoter were dissolved in 30 g of NMP and 15 g of EL to obtain a photosensitive polyimide varnish G.

Using the resulting varnish, pattern processing was evaluated as described above. Sensitivity variation was 0 mJ/cm². Also, a fine pattern having a size of 5 μm or more was remained. In the evaluation of the adhesion property to a substrate, the number of peeled samples was 0, Shrinkage rate was 23%.

Example 8

18.3 g (0.05 mol) of BAHF (manufactured by Tokyo Chemical Industry Co., Ltd.) and 10 g (0.05 mol) of 4,4'-diaminodiphenylether were dissolved in 150 mL of NMP and 50 mL of toluene at 50° C. To the solution, 19.6 g (0.1 mol) of cyclobutanetetracarboxylic dianhydride (manufactured by Tokyo Chemical Industry Co., Ltd.) was added and the reaction was conducted at 50° C. for one hour. After attaching a condenser tube, the temperature of the solution was adjusted to 120° C. while removing water together with toluene out of the system through azeotropy, the reaction was conducted for 2 hours and also the reaction was conducted at 180° C. for 2 hours to obtain a polymer solution containing an alkali-soluble polyimide resin. After the completion of the reaction, 30 mL of the solution was weighed and 2 g of 4NT-300 (trade name, manufactured by Toyo Gosei Co., Ltd.) as a photo acid generator and 1 g of the adhesion promoter B1 obtained in Synthesis Example 10 as an adhesion promoter were added to obtain a varnish H of a photosensitive polyimide.

Using the resulting varnish, pattern processing was evaluated as described above. Sensitivity variation was 25 mJ/cm². Also, a fine pattern having a size of 5 μm or more was remained. In the evaluation of the adhesion property to a substrate, the number of peeled samples was 10. Shrinkage rate was 23%.

Example 9

In the same manner as in Example 1, except that 1 g of DML-MBPC was not added, a varnish I was obtained. Using the resulting varnish, pattern processing was evaluated as described above. Sensitivity variation was 20 mJ/cm². Also, a fine pattern having a size of 10 μm or more was remained. In the evaluation of the adhesion property to a substrate, the number of peeled samples was 0, Shrinkage rate was 28%.

Example 10

In the same manner as in Example 2, except that 2 g of DML-PTBP was not added, a varnish J was obtained. Using the resulting varnish, pattern processing was evaluated as described above. Sensitivity variation was 25 mJ/cm². Also, a fine pattern having a size of 10 μm or more was remained. In the evaluation of the adhesion property to a substrate, the number of peeled samples was 0, Shrinkage rate was 27%.

Example 11

In the same manner as in Example 4, except that 2 g of NIKALACMX-750LM was not added, a varnish K was obtained. Using the resulting varnish, pattern processing was evaluated as described above. Sensitivity variation was 40 mJ/cm². Also, a fine pattern having a size of 10 μm or more was remained. In the evaluation of the adhesion property to a substrate, the number of peeled samples was 0, Shrinkage rate was 26%.

Comparative Example 3

In the same manner as in Example 2, 1 g of the adhesion promoter D1 obtained in Synthesis Example 15 was used as an adhesion promoter in place of the adhesion promoter B2 to obtain a varnish N. With respect to the adhesion property to a substrate, the number of peeled samples was 30. In evaluation of photosensitivity, sensitivity decrease was 200 mJ/cm² and a fine pattern having a size of 40 μm or less was remained.

INDUSTRIAL APPLICABILITY

The heat-resistant resin coat formed of the photosensitive resin composition of the present invention is used for applications such as a passivation layer of a semiconductor, a protective film of a semiconductor device, an interlayer dielectric film of multi-layered wiring for high density mounting, and an insulating layer of an organic electro-luminescent devise.

The invention claimed is:

1. A photosensitive resin composition comprising (a) an alkali-soluble resin, (b) a silicon compound having a secondary aromatic amino group and an alkoxyl group, and (c) at least one substance selected from a photopolymerization initiator, a photo acid generator and a photo base generator, wherein the silicon compound having a secondary aromatic amino group and an alkoxy group (b) is selected from compounds represented by the general formulas (1) to (3):

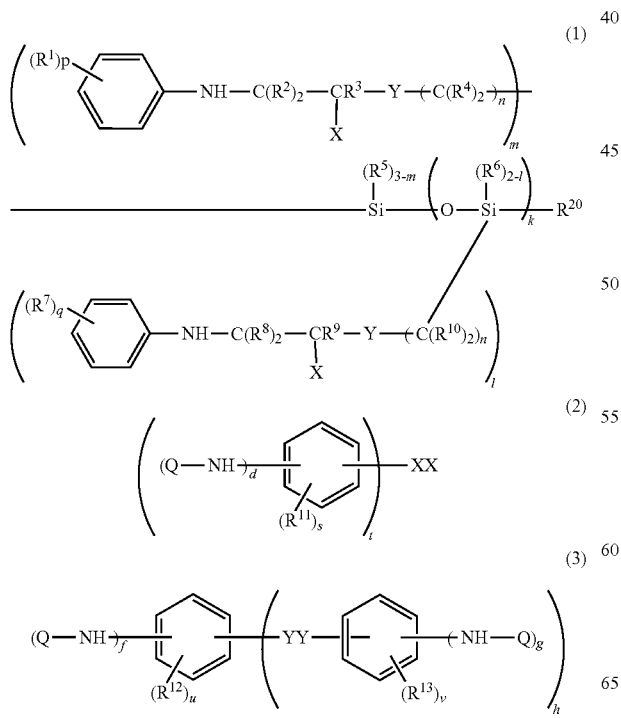

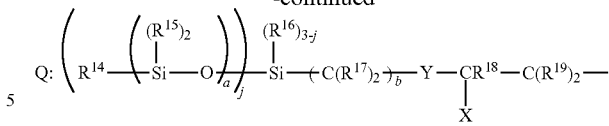

$R^1$, $R^7$, $R^{11}$, $R^{12}$ and $R^{13}$ each represents a group selected from an organic group having 1 or more and 10 or less carbon atoms, a hydroxyl group, a nitro group, an amino group and a carboxyl group; $R^2$, $R^3$, $R^4$, $R^8$, $R^9$, $R^{10}$, $R^{17}$, $R^{18}$ and $R^{19}$ each represents a group selected from a hydrogen atom, an alkyl group having 1 to 6 carbon atoms, an alkenyl group, a phenyl group and a substituted phenyl group, of which $R^2$ and $R^4$, $R^8$ and $R^{10}$, or $R^{17}$ and $R^{19}$ each may be combined to form an aliphatic cyclic structure; $R^5$, $R^6$ and $R^{20}$ each represents a group selected from an alkyl group having 1 to 6 carbon atoms, an alkenyl group, a phenyl group, a substituted phenyl group and an alkoxy group having 1 to 6 carbon atoms, at least one of which is an alkoxy group having 1 to 6 carbon atoms; $R^{14}$, $R^{15}$ and $R^{16}$ each represents a group selected from an alkyl group having 1 to 6 carbon atoms, an alkenyl group, a phenyl group, a substituted phenyl group and an alkoxy group having 1 to 6 carbon atoms, at least one of which is an alkoxy group having 1 to 6 carbon atoms; X represents a group selected from an alkyl group having 1 to 10 carbon atoms, an alkylene group, a nitro group, a hydroxyl group, an alkoxy group, a carboxyl group, an ester group having 2 to 10 carbon atoms and an amide group having 2 to 10 carbon atoms; Y represents a group selected from a single bond, a phenyl group and a —CH₂O— group; XX and YY each represents a single bond or a group selected from the following:

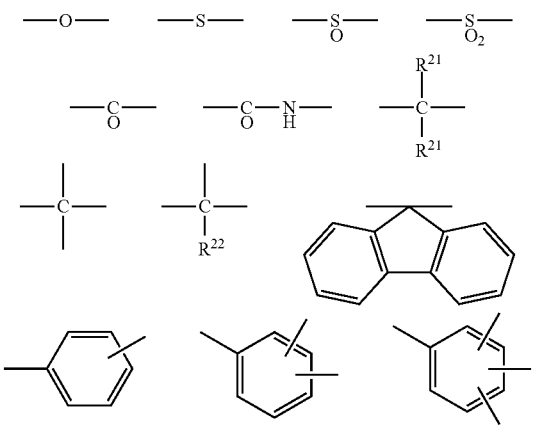

wherein $R^{21}$ and $R^{22}$ each represents a group selected from hydrogen, fluorine, an alkyl group having 1 to 10 carbon atoms, a fluorinated alkyl group having 1 to 10 carbon atoms and an alkoxy group having 1 to 10 carbon atoms; p, q, s, u and v each represents an integer of 1 to 4; m represents an integer of 1 to 3; l represents an integer of 0 to 2, a, b, k and n each represents an integer of 0 to 10; d, f and g each represents an integer of 1 to 4; t and h each represents an integer of 1 to 100; and j represents an integer of 1 to 3.

2. The photosensitive resin composition according to claim 1, which further contains a thermocrosslinking compound having a methylol group or an alkoxymethyl group.

3. The photosensitive resin composition according to claim 1, wherein the silicon compound having a secondary aromatic amino group and an alkoxy group (b) is an adduct of an aromatic amine and an epoxysilane.

4. The photosensitive resin composition according to claim 1, wherein the alkalisoluble resin (a) has a carboxyl group and/or a sulfonic acid group.

5. A method for forming a pattern, which comprises exposing the composition according to claim 1 to ultraviolet ray and developing the exposed composition with an aqueous alkali solution.

* * * * *